US006652646B2

(12) United States Patent
Falster et al.

(10) Patent No.: US 6,652,646 B2
(45) Date of Patent: *Nov. 25, 2003

(54) PROCESS FOR GROWING A SILICON CRYSTAL SEGMENT SUBSTANTIALLY FREE FROM AGGLOMERATED INTRINSIC POINT DEFECTS WHICH ALLOWS FOR VARIABILITY IN THE PROCESS CONDITIONS

(75) Inventors: Robert J. Falster, London (GB); Vladimir Voronkov, Merano (IT); Paolo Mutti, Milan (IT)

(73) Assignee: MEMC Electronic Materials, Inc., St. Peters, MO (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/260,239

(22) Filed: Sep. 30, 2002

(65) Prior Publication Data

US 2003/0116081 A1 Jun. 26, 2003

Related U.S. Application Data

(63) Continuation of application No. 09/853,232, filed on May 11, 2001, now Pat. No. 6,500,255, which is a continuation of application No. 09/344,036, filed on Jun. 25, 1999, now Pat. No. 6,312,516.
(60) Provisional application No. 60/117,623, filed on Jan. 28, 1999, provisional application No. 60/104,303, filed on Oct. 14, 1998, and provisional application No. 60/104,087, filed on Oct. 14, 1998.

(51) Int. Cl.[7] .................................................. C30B 15/00

(52) U.S. Cl. ........................... 117/13; 117/15; 117/932

(58) Field of Search ................................. 117/3, 13, 15, 117/932

(56) References Cited

U.S. PATENT DOCUMENTS

| 4,314,595 A | 2/1982 | Yamamoto et al. |
| 4,981,549 A | 1/1991 | Yamashita et al. |

(List continued on next page.)

FOREIGN PATENT DOCUMENTS

| DE | 39 05 626 A1 | 8/1989 |
| DE | 43 23 964 A1 | 1/1994 |
| DE | 44 14 947 A1 | 8/1995 |
| DE | 198 06 045 A1 | 8/1998 |
| EP | 0 503 816 B1 | 9/1992 |

(List continued on next page.)

OTHER PUBLICATIONS

Abe, T., et al., "The Characteristics of Nitrogen in Silicon Crystals", VLSI Science and Technology/1985, (Electrochem. Soc. Pennington, 1985), Proceedings vol. 85–5, (1985), pp. 543–551.

(List continued on next page.)

Primary Examiner—Kin-Chan Chen
(74) Attorney, Agent, or Firm—Senniger, Powers, Leavitt & Roedel

(57) ABSTRACT

A process for growing a single crystal silicon ingot having an axially symmetric region substantially free of agglomerated intrinsic point defects. The ingot is grown generally in accordance with the Czochralski method; however, the manner by which the ingot is cooled from the temperature of solidification to a temperature which is in excess of about 900° C. is controlled to allow for the diffusion of intrinsic point defects, such that agglomerated defects do not form in this axially symmetric region. Accordingly, the ratio $v/G_0$ is allowed to vary axially within this region, due to changes in $v$ or $G_0$, between a minimum and maximum value by at least 5%.

24 Claims, 6 Drawing Sheets

U.S. PATENT DOCUMENTS

| | | | |
|---|---|---|---|
| 5,264,189 | A | 11/1993 | Yamashita et al. |
| 5,474,020 | A | 12/1995 | Bell et al. |
| 5,485,803 | A | 1/1996 | Habu |
| 5,487,354 | A | 1/1996 | von Ammon et al. |
| 5,667,584 | A | 9/1997 | Takano et al. |
| 5,704,973 | A | 1/1998 | Sakurada et al. |
| 5,728,211 | A | 3/1998 | Takano et al. |
| 5,919,302 | A | 7/1999 | Falster et al. |
| 5,935,320 | A | 8/1999 | Graef et al. |
| 5,942,032 | A | 8/1999 | Kim et al. |
| 5,954,873 | A | 9/1999 | Hourai et al. |
| 5,968,262 | A | 10/1999 | Saishouji et al. |
| 5,968,264 | A | 10/1999 | Iida et al. |
| 6,045,610 | A | 4/2000 | Park et al. |
| 6,053,974 | A | 4/2000 | Luter et al. |
| 6,093,913 | A | 7/2000 | Schrenker et al. |
| 6,153,008 | A | 11/2000 | von Ammon et al. |
| 6,228,164 | B1 | 5/2001 | von Ammon et al. |
| 6,236,104 | B1 | 5/2001 | Falster |
| 6,284,039 | B1 * | 9/2001 | Mule'Stagno et al. ......... 117/3 |
| 6,312,516 | B2 * | 11/2001 | Falster et al. ................. 117/13 |
| 6,500,255 | B2 * | 12/2002 | Falster et al. ................. 117/13 |

FOREIGN PATENT DOCUMENTS

| | | |
|---|---|---|
| EP | 0 504 837 A2 | 9/1992 |
| EP | 0 536 958 A1 | 4/1993 |
| EP | 0 716 168 A1 | 12/1996 |
| EP | 0 747 513 A2 | 12/1996 |
| EP | 0 866 150 | 9/1998 |
| EP | 0 890 662 | 1/1999 |
| EP | 0 909 840 | 4/1999 |
| EP | 0 962 555 | 12/1999 |
| EP | 0 962 556 A1 | 12/1999 |
| EP | 0 962 557 A1 | 12/1999 |
| GB | 2 137 524 A | 10/1984 |
| GB | 2 182 262 A | 5/1987 |
| JP | Hei 2-180789 | 7/1990 |
| JP | Hei 3-093700 | 4/1991 |
| JP | Hei 4-108682 | 4/1992 |
| JP | HO 8-268794 | 10/1996 |
| JP | Hei 07-158458 | 12/1996 |
| JP | HO 9-202690 | 8/1997 |
| JP | 11-157995 A | 6/1999 |
| JP | 11-180800 A | 7/1999 |
| JP | 11-189495 A | 7/1999 |
| JP | 11-199386 A | 7/1999 |
| JP | 11-199387 A | 7/1999 |
| WO | WO 97/26393 | 7/1997 |
| WO | WO 98/45507 | 10/1998 |
| WO | WO 98/45508 | 10/1998 |
| WO | WO 98/45509 | 10/1998 |
| WO | WO 98/45510 | 10/1998 |

OTHER PUBLICATIONS

Abe, T., et al., "Behavior of Point Defects in FZ Silicon Crystals", Semiconductor Silicon 1990, *Proceedings of the Sixth International Symposium on Silicon Materials Science and Technology*, vol. 90–7 (1990), pp. 105–116.

von Ammon, W., et al. "The Dependence of bulk defects on the axial temperature gradient of silicon crystals during Czochralski growth" Journal of Crystal Growth, vol. 151 (1995) pp. 273–277.

von Ammon, W., et al. "Bulk properties of very large diameter silicon single crystals" Journal of Crystal Growth, vol. 198/199, (1999), pp. 390–398.

de Kock, A.J.R.,"The Elimination of Vacancy–Cluster Formation in Dislocation –Free Silicon Crystals", J. of the Electrochem. Soc.: Solid–State Science And Technology, vol. 118, No. 11, (Nov. 1971), pp. 1851–1856.

de Kock, A.J.R, et al., "The Effect of Doping on the Formation of Swirl Defects in Dislocation–Free Czochralski–Grown Silicon Crystals", Journal of Crystal Growth, vol. 49, (1980) pp. 718–734.

de Kock, A.J.R., et al., "Effect of Growth Parameters on Formation and Elimination of Vacancy Clusters in Dislocation–Free Silicon Crystals", Journal of Crystal Growth, vol. 22 (1974), pp. 311–320.

Dornberger, E., et al., "The Impact of Dwell Time Above 900° C During Crystal Growth on the Gate Oxide Integrity of Silicon Wafers", Electrochemical Society Proceedings, vol. 96, No. 13, pp. 140–151.

Dornberger, E., et al., "The Dependence of Ring Like Distributed Stacking Falts on the Axial Temperature Gradient of Growing Czochralski Silicon Crystals" Electrochemical Society Proceedings, vol. 95–4, (May 1995) pp. 294–305.

Dornberger, E., et al., "Simulation of Grown–In Voids in Czochralski Silicon Crystals", Electrochemical Society Proceedings, vol. 97–22, pp. 40–49.

Dornberger, E., et al., "Simulation of Non–Uniform Grown–In Void Distributions in Czochralski Silicon Crystals", Electrochemical Society Proceegings, vol. 98, vol. 1, pp. 490–503.

Eidenzon, A.M., et al., "Defect–Free Silicon Crystals Grown By The Czochralski Technique"; Inorganic Materials, vol. 33, No. 3, (1997) pp. 219–225.

Eidenzon, A.M., et al., "Influence Of Growth Rate On Swirl Defects In Large Dislocation–Free Crystals Of Silicon Grown By The Czochralski Method", Sov. Phys. Crystallogr.; vol. 30, No. 5 (1985) pp. 576–580.

Faslter, R., et al., "Intrinsic Point–Defects and Reactions in the Growth of Large Silicon Crystals", Electrochemical Society Proceedings, vol. 98–1, pp. 468–489.

Foll, H., et al. "The Formation of Swirl Defects in Silicon by Agglomeration of Self–Interstitials", Journal of Crystal Growth, 1977, pp. 90–1087, vol. 40, North–Holland Publishing Company.

Hourai, M., et al., "Improvement of Gate Oxide Integrity Characteristics of CZ–Grown Silicon Crystals", Progress in Semiconductor Fabrication presented by: Semiconductor Equipment and Materials International, Semicon/Europa 93, Mar. 30–Apr. 1, 1993, Geneva, Switzerland.

Hourai, M., et al. "Growth Parameters Determining the Type of Grown–In Defects in Czockralski Silicon Crystals", Materials Science Forum, vols. 196–201 (1995) pp. 1713–1718.

Kissinger, G., et al. "A Method for Studying the Grown–In Defect Density Spectra in Czochralski Silicon Wafers" Journal of Electrochemical Society, vol. 144, No. 4, (1997) pp. 1447–1456.

Lemke, H., et al., "Analytical Approximations for the Distributions of Intrinsic Point Defects in Grown Silicon Crystals", Phys. Stat. Sol. (a) vol. 176 (1999), pp. 843–865.

Nakamura, K., et al., "Formation Process of Grown–In Defects in Czochralski Grown Silicon Crystals", Journal of Crystal Growth, vol. 180, (1997) pp. 61–72.

Park, J.G., et al., "Effect of Crystal Defects on Device Characteristics", *Proceedings of the Symposium on* Crystalline Defects and Contamination: Their Impact And Control in Device Manufacturing II, Proceed. vol. 97–22 (1997), pp. 173–195.

Puzanov, N.I.,et al., "Relaxation In A System Of Point Defects In A Growing Dislocation–Free Crystal Of Silicon", Sov. Phys. Crystallogr., vol. 31, No. 2, (1986) pp. 219–222.

Puzanov, N.I., et al., "Influence of Transitional Crystallization Regimes on Microdefects in Silicon", USSR Academy of Sciences Newsletter, vol. 22, No. 8 (1986), pp. 1237–1242.

Puzanov, N.I., et al., "The effect of thermal history during crystal growth on oxygen precipitation in Czochralski–grown silicon", Semicond. Sci. Technol., vol. 7, (1992), pp. 406–413.

Puzanov, N., et al., "Formation of the bands of anomalous oxygen precipitation in Czochralski–grown Si crystals" Journal of Crystal Growth vol. 137, (1994), pp. 642–652.

Puzanov, N., et al., "The Role of Intrinsic Point Defects in the Formation of Oxygen Precipitation Centers in Dislocation–Free Silicon" Crystallography Reports, vol. 41, No. 1, (1996), pp. 134–141.

Puzanov, N.I., et al., "Cultivation, Morphology and Structural Integrity of Dislocation–Free Silicon Tetracrystals", Inorganic Materials, vol. 32, No. 8 (1996), pp. 903–912.

Puzanov, N.L., et al., "Harmful Microdefects in the Seed–End Portion of Large–Diameter Silicon Ingots", Inorganic Materials, vol. 33, No. 8, (1997) pp. 765–769.

Puzanov, N., et al., "Modelling microdefect distribution in dislocation–free Si crystals grown from the melt", Journal of Crystal Growth, 178, (1997), pp. 468–478.

Puzanov, N., et al., "Role of Vacancies in the Nucleation of Ringlike–patterned Oxidation–induced Stacking Faults in Melt–grown Silicon Crystals" Inorganic Materials, vol. 34–4, (1998) pp. 307–314.

Roksnoer, P.J., "Microdefects in a Non–Striated Distribution in Floating–Zone Silicon Crystals", Journal of Crystal Growth, vol. 53 (1981), pp. 563–573.

Roksnoer, P.J., "The Mechanism of Formation of Microdefects in Silicon", Journal of Crystal Growth, vol. 68 (1984), pp. 596–612.

Shimanuki, Y., et al., "Effects of Thermal History on Microdefect Formation in Czochralski Silicon Crystals", Japanese Journal of Applied Physics, vol. 24, No. 12, (1985), pp. 1594–1599.

Sinno, T., et al., "On the Dynamics of the Oxidation–Induced Stacking–Fault Ring in as–grown Czochralski silicon crystals", Applied Physics Letters, vol. 70, No. 17, (1997) pp. 2250–2252.

Sinno, T., et al., "Point Defect Dynamics and the Oxidation–Induced Stacking–Fault Ring in Czochralski–Grown Silicon Crystals", J. Electrochem. Soc., vol. 145, No. 1, (1998) pp. 302–318.

Tan, T. Y., "Point Defects, Diffusion Processes, and Swirl Defect Formation in Silicon", Appl. Phys. A., vol. 37, (1985) pp. 1–17.

VanHellemont, J., et al., "Defects in As–Grown Silicon and Their Evolution During Heat Treatments", Materials Science Forum, vols. 258–263, (1997) pp. 341–346.

Voronkov,V., "The Mechanism of Swirl Defects Formation in Silicon", Journal of Crystal Growth, vol. 59 (1982) pp. 625–643.

Voronkov, V., et al., "Behaviour and Effects of Intrinsic Point Defects in the Growth of Large Silicon Crystals", Electrochemical Society proceedings, vol. 97–22, (Aug. 1997), pp. 3–17.

Voronkov, V.V., et al., "Vacancy–type microdefect formation in Czochralski silicon", Journal of Crystal Growth 194 (1998) 76–88.

Voronkov, V., et al., "Grown–in microdefects, residual vacancies and oxygen precipitation banks in Czochralski silicon" Journal of Crystal Growth, 304 (1999) pp. 462–474.

Wijaranakula, W., "Numerical Modeling of the Point Defect Aggregation during the Czochralski Silicon Crystal Growth", Journal of Electrochemical Society, vol. 139, No. 2 (Feb. 1992), pp. 604–616.

Winkler, R., et al. "Improvement of the Gate Oxide Integrity by Modifying Crystal Pulling and Its Impact on Device Failures" Journal of the Electrochemical Society, vol. 141, No. 5 (May 1994) pp. 1398–1401.

Zimmerman, H., et al. "Gold and Platinum Diffusion: the Key to the Understanding of Intrinsic Point Defect Behavior in Silicon", Applied Physics A Solids and Surfaces, vol. A55, No. 1 (1992) pp. 121–134.

Zimmerman, H., et al. "Vacancy concentration wafer mapping in silicon" Journal of Crystal Growth, vol. 129, (1993) pp. 582–592.

* cited by examiner

PROCESS FOR GROWING A SILICON CRYSTAL SEGMENT SUBSTANTIALLY FREE FROM AGGLOMERATED INTRINSIC POINT DEFECTS WHICH ALLOWS FOR VARIABILITY IN THE PROCESS CONDITIONS

CROSS-REFERENCE TO RELATED APPLICATION

This application is a continuation of U.S. application Ser. No. 09/853,232, filed May 11, 2001, U.S. Pat. No. 6,500,255, which is a continuation of U.S. application Ser. No. 09/344,036, filed Jun. 25, 1999, U.S. Pat. No. 6,312,516, which claims the benefit of U.S. Provisional Application Serial No. 60/117,623, filed Jan. 28, 1999, U.S. Provisional Application Serial No. 60/104,303, filed on Oct. 14, 1998, and U.S. Provisional Application Serial No. 60/104,087, filed on Oct. 14, 1998.

BACKGROUND OF THE INVENTION

The present invention generally relates to the preparation of semiconductor grade single crystal silicon which is used in the manufacture of electronic components. More particularly, the present invention relates to a process for producing a single crystal silicon ingot in which at least a segment of the constant diameter portion of the ingot is substantially devoid of agglomerated intrinsic point defects, wherein $v/G_0$ is allowed to vary over the length of the segment as a result of controlling the manner in which the segment cools to a temperature at which agglomerated intrinsic defects would otherwise form.

Single crystal silicon, which is the starting material for most processes for the fabrication of semiconductor electronic components, is commonly prepared by the so-called Czochralski ("Cz") method. In this method, polycrystalline silicon ("polysilicon") is charged to a crucible and melted, a seed crystal is brought into contact with the molten silicon and a single crystal is grown by slow extraction. After formation of a neck is complete, the diameter of the crystal is enlarged by decreasing the pulling rate and/or the melt temperature until the desired or target diameter is reached. The cylindrical main body of the crystal which has an approximately constant diameter is then grown by controlling the pull rate and the melt temperature while compensating for the decreasing melt level. Near the end of the growth process but before the crucible is emptied of molten silicon, the crystal diameter must be reduced gradually to form an end-cone. Typically, the end-cone is formed by increasing the crystal pull rate and heat supplied to the crucible. When the diameter becomes small enough, the crystal is then separated from the melt.

In recent years, it has been recognized that a number of defects in single crystal silicon form in the crystal growth chamber as the crystal cools after solidification. Such defects arise, in part, due to the presence of an excess (i.e., a concentration above the solubility limit) of intrinsic point defects in the crystal lattice, which are vacancies and self-interstitials. Silicon crystals grown from a melt are typically grown with an excess of one or the other type of intrinsic point defect, either crystal lattice vacancies ("V") or silicon self-interstitials ("I").

Vacancy-type defects are recognized to be the origin of such observable crystal defects as D-defects, Flow Pattern Defects (FPDs), Gate Oxide Integrity (GOI) Defects, Crystal Originated Particle (COP) Defects, crystal originated Light Point Defects (LPDs), as well as certain classes of bulk defects observed by infrared light scattering techniques such as Scanning Infrared Microscopy and Laser Scanning Tomography. Also present in regions of excess vacancies are defects which act as the nuclei for ring oxidation induced stacking faults (OISF). It is speculated that this particular defect is a high temperature nucleated oxygen agglomerate catalyzed by the presence of excess vacancies.

Defects relating to self-interstitials are less well studied. They are generally regarded as being low densities of interstitial-type dislocation loops or networks. Such defects are not responsible for gate oxide integrity failures, an important wafer performance criterion, but they are widely recognized to be the cause of other types of device failures usually associated with current leakage problems.

It is believed that the type and initial concentration of these point defects in the silicon are determined as the ingot cools from the temperature of solidification (i.e., about 1410° C.) to a temperature greater than about 1300° C. That is, the type and initial concentration of these defects are controlled by the ratio $v/G_0$, where v is the growth velocity and $G_0$ is the average axial temperature gradient over this temperature range. Referring to FIG. 1, for increasing values of $v/G_0$, a transition from decreasingly self-interstitial dominated growth to increasingly vacancy dominated growth occurs near a critical value of $v/G_0$ which, based upon currently available information, appears to be about $2.1 \times 10^{-5}$ cm$^2$/sK, where $G_0$ is determined under conditions in which the axial temperature gradient is constant within the temperature range defined above. At this critical value, the concentrations of these intrinsic point defects are at equilibrium. However, as the value of $v/G_0$ exceeds the critical value, the concentration of vacancies increases. Likewise, as the value of $v/G_0$ falls below the critical value, the concentration of self-interstitials increases. If the concentration of vacancies or self-interstitials reaches a level of critical supersaturation in the system, and if the mobility of the point defects is sufficiently high, a reaction, or an agglomeration event, will likely occur. Under conventional Czochralski-type growth conditions, the density of vacancy and self-interstitial agglomerated defects is typically within the range of about $1 \times 10^3$/cm$^3$ to about $1 \times 10^7$/cm$^3$. While these values are relatively low, agglomerated intrinsic point defects are of rapidly increasing importance to device manufacturers and, in fact, are now seen as yield-limiting factors in the fabrication of complex and highly integrated circuits.

Preventing the formation of agglomerated intrinsic point defects may be achieved by controlling the growth velocity, v, and the average axial temperature gradient, $G_0$, such that the ratio of $v/G_0$ is maintained within a very narrow range of values near the critical value of $v/G_0$ (see, e.g., FIG. 1, generally represented by range X), thus ensuring that the initial concentration of self-interstitials or vacancies does not exceed some critical concentration at which an agglomeration reaction occurs. However, if control of $v/G_0$ alone is to be relied upon in order to prevent the formation of agglomerated intrinsic point defects, stringent process control and crystal puller design requirements must be met in order to maintain $v/G_0$ within this narrow range.

Maintaining v/G within a narrow range of values is not the most commercially practical approach to preventing the formation of agglomerated intrinsic point defects, for a number of reasons. For example, the pull rate is often varied during the growth process in order to maintain a constant diameter of the ingot. Variations in the pull rate, however, result in changes in v which, in turn, impacts $v/G_0$, causing it to vary axially over the length of the ingot. Similarly, changes in $G_0$ may occur as well, due to changes in other process parameters. Furthermore, it should be noted that $G_0$ often changes over time as a result of aging of the components of the hot zone or as a result of the inside of the hot zone becoming coated with, for example, silicon dioxide. The changes in v and $G_0$ likewise cause changes in the "target" range for $v/G_0$ (i.e., the range which limits the initial concentration of intrinsic point defects such that agglomerations do not occur), unless a corresponding and offsetting change is made in $G_0$ or v, respectively. Therefore, if a given crystal puller is to be utilized to grow a series of ingots, the temperature profile of that crystal puller must be continuously monitored and the process conditions repeatedly modified as changes in v or $C_0$ dictate. Such an approach is both time consuming and costly.

SUMMARY OF THE INVENTION

Among the several objects and features of the present invention may be noted the provision of a process for producing single crystal silicon, in ingot or wafer form, having an axially symmetric region which is substantially free of agglomerated intrinsic point defects; the provision of such a process in which a segment of the ingot is allowed to dwell above a temperature at which agglomerated defects would otherwise form (i.e., the critical or agglomeration temperature) for a time sufficient to prevent the formation of agglomerated defects within the segment; the provision of such a process wherein $v/C_0$ is allowed to vary axially during ingot growth, as a result of changes in v or $G_0$; and, the provision of such a process in which the manner by which the ingot is cooled between the temperature of solidification and the agglomeration temperature is controlled to prevent the formation of agglomerated intrinsic point defects.

Briefly, therefore, the present invention is direction to process for growing a single crystal silicon ingot having a central axis, a seed-cone, an end-cone, a constant diameter portion between the seed-cone and the end-cone, and an ingot segment which comprises a fraction of the constant diameter portion and which is substantially free of agglomerated intrinsic point defects. The process comprises (i) allowing the ratio $v/C_0$ to vary as a function of the length of the ingot segment as the ingot is grown, with $v/C_0$ being allowed to vary between a minimum value, $(v/G_0)_{min}$, and a maximum value, $(v/G_0)_{max}$, where v is the growth velocity and $G_0$ is the average axial temperature gradient between the temperature of solidification and about 1300° C. at the central axis, with $(v/G_0)_{min}$ being no more than about 95% of $(v/G_0)_{max}$; and, (ii) cooling the ingot segment from the temperature of solidification to a temperature between about 1050° C. and about 900° C. over a dwell time, $t_{dw}$, which is sufficient to prevent the formation of agglomerated intrinsic point defects within the segment.

The present invention is further directed to a process for growing a single crystal silicon ingot having a central axis, a seed-cone, an end-cone, a constant diameter portion between the seed-cone and the end-cone having a circumferential edge and a radius extending from the central axis to the circumferential edge, the ingot being characterized in that, after the ingot is grown from a silicon melt and cooled from the solidification temperature in accordance with the Czochralski method, the constant diameter portion contains an axially symmetric region which is substantially free of agglomerated intrinsic point defects. The process comprises controlling (i) a growth velocity, v, and an average axial temperature gradient, $G_0$, during the growth of the constant diameter portion of the ingot over a temperature range from solidification to about 1300° C.; and, (ii) the cooling rate of the axially symmetric region, the axially symmetric region cooling from a first temperature, $T_1$, which is between about 1400° C. and about 1300° C., to a second temperature, $T_2$, which is between about 1050° C. and about 800° C., with the rate of temperature decrease from $T_1$ to $T_2$ being controlled such that at each intermediate temperature, $T_{int}$ between $T_1$ and $T_2$, the axially symmetric region has a concentration of silicon self-interstitial intrinsic point defects which is less than a critical concentration at which agglomerated intrinsic point defects form. The axially symmetric region has a width, as measured radially from the circumferential edge toward the central axis, which is at least about 30% of the width of the constant diameter portion of the ingot and has a length which is at least about 20% of the length of the constant diameter portion of the ingot.

Other objects and features of the present invention will be in part apparent and in part pointed out hereinafter.

DETAILED DESCRIPTION OF THE PREFERRED EMBODIMENTS

Figure 1:
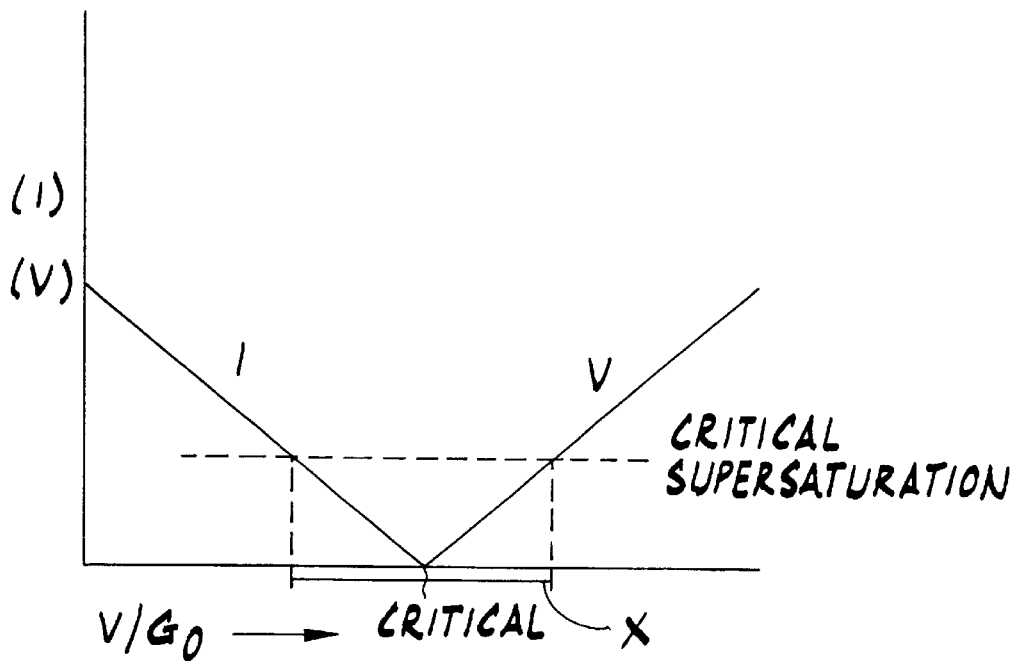
FIG. 1 is a graph which shows an example of how the initial concentration of self-interstitials, [I], and vacancies, [V], changes with an increase in the value of the ratio $v/G_0$, where v is the growth velocity and $G_0$ is the average axial temperature gradient.

In accordance with the present invention, it has been discovered that controlled cooling may be utilized in the preparation of substantially defect-free silicon to provide sufficient process control flexibility or robustness, such that $v/G_0$ may vary or "wander" outside the narrow, target range of values that would otherwise have to be employed to prevent the formation of agglomerated intrinsic point defects.

Control of Growth Conditions

Previously, it has been reported that process conditions can be controlled during growth of a single crystal silicon ingot, prepared in accordance with the Czochralski method, such that the constant diameter portion of the ingot contains a region or segment which is substantially free of agglomerated intrinsic point defects. (See, e.g., PCT/US98/07365 and PCT/US98/07304.) As disclosed therein, growth conditions, including growth velocity, v, the average axial temperature gradient, $G_0$, between the temperature of solidification and a temperature greater than about 1300° C., and the cooling rate from solidification to about 1050° C., are controlled to cause the formation of an axially symmetric region which is substantially free of agglomerated intrinsic point defects.

These growth conditions are preferably controlled to maximize the volume of this axially symmetric region relative to the volume of the constant diameter portion of the ingot. When silicon self-interstitials are the predominant type of intrinsic point defect, the axially symmetric region typically has a width equal to at least about 30% of the radius of the ingot, with widths of at least about 40%, 60%, 80%, 90% and 95% being more preferred. Similarly, when vacancies are the predominant type of intrinsic point defect, the axially symmetric region has a width which is at least about 15 mm. Preferably, however, this region has a width which is equal to at least about 7.5% of the radius of the ingot, with widths of at least about 15%, 25% and 50% being more preferred. Regardless of which intrinsic point defect predominates, most preferably the width of the region is about equal to the radius of the ingot. Furthermore, this axially symmetric region typically extends over a length of at least about 20% of the constant diameter portion of the ingot, with lengths of at least about 40%, 60%, 80%, 90% and even about 100% being more preferred.

As described elsewhere (see, e.g., PCT/US98/07365 and PCT/US98/07304), it is generally believed that the formation of such an axially symmetric region is achieved as a result of suppressing the reactions in which silicon self-interstitials or crystal lattice vacancy intrinsic point defects react to produce agglomerated intrinsic point defects. This suppression is achieved by controlling the concentration of these intrinsic point defects in this axially symmetric region during the growth and cooling of the ingot to ensure this region never become critically supersaturated. Preventing critical supersaturation, or the agglomeration of intrinsic point defects, can be achieved by establishing an initial concentration (controlled by $v/G_0(r)$, where $G_0$ is a function of radius) which is sufficiently low such that critical supersaturation is never achieved. However, such an approach requires that the actual value of $v/G_0$ be maintained within a narrow, target range of values very close to the critical value of $v/G_0$.

Strict process control and system design requirements must be continuously met if $v/G_0(r)$ is to be maintained within this target range of values, because even minor changes in v or $G_0$ may cause the actual value of $v/G_0$ to move outside this range. Stated another way, in the absence of controlled cooling to provide sufficient dwell time above a temperature at which agglomeration would otherwise occur, and thus allow for the diffusion of vacancies or interstitials to sinks where they may be annihilated, $v/G_0$ must be maintained within this narrow "window" of values over the radius, extending from about the central axis to within a few centimeters (i.e., about 1 to 2 cm) from the circumferential edge of the ingot. Such process conditions may be expressed by Equation (1):

$$[(v/G_0)_{cr}+\delta] \geq v/G_0(r) \geq [(v/G_0)_{cr}-\Delta] \qquad (1)$$

wherein $[(v/G_0)_{cr}+\Delta]$ is the sum of the critical value for $v/G_0$ plus some delta, which based on experimental evidence to-date is believed to be less than about 5% of the critical value, to account for a region of vacancy dominated material which is substantially free of agglomerated defects;

$v/G_0(r)$ is the actual value of $v/G_0$ at a given radial position extending from the central axis to within a few centimeters from the circumferential edge of the ingot; and, $[(v/G_0)_{cr}-\Delta]$ is the difference between the critical value for $v/G_0$ minus some delta, which based on experimental evidence to-date is believed to be less than about 5% of the critical value, to account for a region of self-interstitial dominated material which is substantially free of agglomerated defects.

In practice, meeting such stringent process control conditions is difficult to achieve, and is complicated by the fact that this window of acceptable values for $v/G_0$ may change over time in a given crystal puller. Preferably, therefore, preventing the system from becoming critically supersaturated, and thus preventing the formation of agglomerated intrinsic point defects, is achieved by suppressing the initial concentration of silicon self-interstitials or vacancies subsequent to crystal solidification, i.e., subsequent to establishing the initial concentration as determined by $v/G_0(r)$. As noted in PCT/US98/07365 and PCT/US98/07304, it has been found that due to the relatively large mobility of self-interstitials, it is possible to effectively suppress the concentration of self-interstitials over relatively large distances, i.e. distances of about 5 cm to about 10 cm or more, by the diffusion of self-interstitials to sinks located at the crystal surface or to vacancy dominated regions located within the crystal. Diffusion can be effectively used to suppress the concentration of self-interstitials, provided sufficient time is allowed. In general, the diffusion time will depend upon the radial variation in the initial concentration of self-interstitials, with lesser radial variations requiring shorter diffusion times.

The amount of self-interstitial diffusion is controlled by controlling the time during which the ingot is cooled from the solidification temperature (about 1410° C.) to the temperature at which silicon self-interstitials become immobile, for commercially practical purposes. Silicon self-interstitials appear to be extremely mobile at temperatures near the solidification temperature of silicon, i.e. about 1410° C. This mobility, however, decreases as the temperature of the single crystal silicon ingot decreases. Generally, the diffusion rate of self-interstitials slows such a considerable degree that they are essentially immobile for commercially practical time periods at temperatures less than about 900° C. However, while the temperature at which a self-interstitial agglomeration reaction occurs may in theory vary over a wide range of temperatures, as a practical matter this range appears to be relatively narrow as a consequence of the relatively narrow range of initial self-interstitial concentrations which are typically obtained in silicon grown according to the Czochralski method. In general, therefore, a self-interstitial agglomeration reaction may occur, if at all, at temperatures within the range of about 1050° C. to about 900° C., and typically at a temperature of about 925° C. or about 950° C.

Effects of Diffusion

Within the range of temperatures at which self-interstitials appear to be mobile, and depending upon the temperature in the hot zone, the cooling time will typically be controlled such that the ingot resides, or "dwells", within this range for a time which is sufficient to allow enough self-interstitials to diffuse such that critical supersaturation does not occur. By controlling this dwell time, $t_{dw}$, the otherwise stringent $v/G_0$ requirements are relaxed and a larger range of $v/G_0$ values, relative to the critical value, which are acceptable for purposes of preventing the formation of agglomerated defects are afforded. Such a relationship may be expressed by Equation (2):

$$[(v/G_0)_{cr}+\Delta] > v/G_0(r_0) > [(v/G_0)_{cr} - \Delta(t)_{cr}] \quad (2)$$

wherein

[$(v/G_0)_{cr}+\Delta$] is the same as in Equation (1), above;

$v/G_0(r_0)$ is the actual value of $v/G_0$ at about the central axis (given that the diffusion distance is typically the greatest at this point); and,

[$(v/G_0)_{cr}-\Delta(t)_{cr}$] is the difference between the critical value for $v/G_0$ minus some delta, the delta being a factor of how much time a given axial position within the ingot is allowed to dwell above the critical temperature (i.e., the temperature at which agglomerations would otherwise occur).

It may be observed from Equation (2) that as the dwell time increases, there is greater opportunity for the actual value of $v/G_0$ to vary axially within the segment that is substantially defect-free; that is, as the dwell time increases, the actual value of $v/G_0$ may deviate further from the target range of values that would otherwise result in the formation of a substantially defect-free segment of the ingot if diffusion was not utilized. Furthermore, it may be observed that the focus is on $v/G_0$ near the central axis because the diffusion distance is typically greatest at this point.

In view of the forgoing and as noted in, for example, PCT/US98/07365 and PCT/US98/07304, typically the axially symmetric region will be allowed to dwell at a temperature between the temperature of solidification and a temperature between about 1050° C. and about 900° C., and preferably between about 1025° C. about 925° C., for a period of (i) at least about 5 hours, preferably at least about 10 hours, and more preferably at least about 15 hours for 150 mm nominal diameter silicon crystals, (ii) at least about 5 hours, preferably at least about 10 hours, more preferably at least about 20 hours, still more preferably at least about 25 hours, and most preferably at least about 30 hours for 200 mm nominal diameter silicon crystals, and (iii) at least about 20 hours, preferably at least about 40 hours, more preferably at least about 60 hours, and most preferably at least about 75 hours for silicon crystals having a nominal diameter greater than 200 mm. It is to be noted, however, that the precise time and temperature to which the ingot is cooled is at least in part a function of the concentration of intrinsic point defects, the number of point defects which must be diffused in order to prevent supersaturation and agglomeration from occurring, and the rate at which the given intrinsic point defects diffuse (i.e., the diffusivity of the intrinsic point defects).

The dwell time, or the manner by which the ingot cools, is at least in part a function of the growth velocity and the design of the hot zone of the crystal puller; that is, ingot cooling may be affected by changes in the pull rate and also the configuration of the hot zone. Changes in hot zone configuration can be made using any means currently know in the art for minimizing heat transfer in the hot zone, including reflectors, radiation shields, purge tubes, light pipes, insulators, heaters and magnetic fields.

Process Variability

Controlling the dwell time of a given segment of the constant diameter portion o~ the ingot, such that intrinsic point defects may diffuse to sinks where they are annihilated and thus prevent the formation of agglomerated defects therein, allows the ratio $v/G_0$ to vary axially; that is, as a result of controlling the manner by which this segment of the ingot cools, the ratio $v/G_0$ may change as a function of the length of the axially symmetric region. In accordance with the present process, therefore, the actual value of the ratio $v/G_0$ may be allowed to vary as a function of the length of the axially symmetric region as the ingot is grown between a minimum value, $(v/G_0)_{min}$, and a maximum value, $(v/G_0)_{max}$. In one embodiment of the present process, $(v/G(_0)_{min}$ is no more than about 95% of $(v/G_0)_{max}$, while in other embodiments $(v/G_0)_{min}$ is no more than about 90%, 85% or even 80% of $(v/G_0)_{max}$. Stated another way, in one embodiment the actual value of $v/G_0$ may vary by at least about 5% between $(v/G_0)_{min}$ and $(v/G_0)$ max, while in other embodiments $v/G_0$ may vary between $(v/G_0)_{min}$ and $(v/G_0)_{max}$ by at least about 10%, 15%, 20% or more.

As used herein and as described in Equation (2) above, $(v/G_0)_{max}$ is intended to refer to $(v/G_0)_{cr}$ plus some delta to account for the region of vacancy dominated material which is substantially free of agglomerated defects. Furthermore, if growth conditions are such that the ingot comprises both vacancy and interstitial dominated material which are substantially free of agglomerated defects, then $(v/G_0)_{max}$ is intended to refer to $[(v/G_0)_{cr}+\delta(t)_{cr}]$ which, as further discussed below in reference to Equation 3, represents the sum of the critical value of $v/G_0$ plus some delta which is a factor of how much time a given axial position within the ingot is allowed to dwell above the critical temperature (i.e., the temperature at which agglomerations would otherwise occur).

It is to be noted that the above ranges for axial variations in the ratio $v/G_0$ refer to the values of $v/G_0$ within the axially symmetric region of the ingot which is substantially free of agglomerated intrinsic point defects. Furthermore, $v/G_0$ may also vary radially $(v/G_0(r))$. It is therefore to be understood that $(V/G_0)_{min}$ and $(v/G_0)_{max}$ generally refer to the minimum and maximum values for $v/G_0(r)$, respectively, within the axially symmetric region. However, when growth conditions are controlled such that the axially symmetric region extends from the central axis to the circumferential edge of the ingot, variations in $v/G_0$ are typically determined based on the value of $v/G_0$ at the central axis because the diffusion distance is greatest at this position, provided there is little or no contribution from axial diffusion.

It is also to be noted that, as further described in detail below in reference to FIGS. 4 and 5, when the variations in $v/G_0$ are due to changes in v (i.e., $G_0$ is constant), the axial variations in $v/G_0$ may be significantly greater; that is, when iriterstitials predominate and when variations in $v/G_0$ are due to changes in v, $(v/G_0)_{min}$ may be no more than about 60%, 40%, 20%, 10% or even 5% of $(v/G_0)_{max}$. In other words, provided there is sufficient dwell time, the "window" of acceptable values for $v/G_0$ may essentially be any value less than the critical value for $v/G_0$. Experience to-date suggests that, as illustrated in FIG. 5, once the dwell time is sufficient for $v/G_0$ to vary by about 20% (i.e., when $(v/G_0)_{min}$ is no more than about 80% of $(v/G_0)_{max}$), $(v/G_0)_{min}$ may essentially be any value less than $(v/G_0)_{max}$.

While $v/G_0$ may vary as described above when $G_0$ is constant and v is allowed to change, it is to be noted that $v/G_0$ may also vary when v is constant and $G_0$ is allowed to change. More specifically, as further described in detail below in reference to FIGS. 10 and 11, the acceptable degree of variation in $v/G_0$ resulting from changes in $G_0$ increases as the dwell time increases. However, as FIGS. 10 and 11 indicate, the "window" of acceptable values for $v/G_0$ when v is constant and $G_0$ is allowed to vary does not have a dwell time plateau where this window of values becomes essentially wide open, allowing for any value less than the critical value for $v/G_0$. Rather, the degree of acceptable variation (i.e., variation in $v/G_0$ which may occur without the formation of agglomerated defects) continues to increase as the dwell time increases.

As discussed above, by allowing the axially symmetric region to dwell above about 900° C. for an extended period of time, the otherwise stringent $v/G_0$ requirements are relaxed and a larger range of $v/G_0$ values, relative to the critical value, are acceptable for purposes of preventing the formation of agglomerated intrinsic point defects and growing a single crystal silicon ingot as described herein. For example, if the width of the axially symmetric region in which interstitials are the predominant intrinsic point defect is to be about equal to the radius of the ingot, then the growth velocity, v, and the average axial temperature gradient, $G_0$, (as previously defined) may be controlled such that the ratio $v/G_0$ is between about 0.75 to about 1 times the critical value of $v/G_0$ (i.e., about $1.6 \times 10^{-5}$ cm$^2$/sK to about $2.1 \times 10^{-5}$ cm$^2$/sK based upon currently available information for the critical value of $v/G_0$). Typically, however, in view of the flexibility provided by the present process, the ratio $v/G_0$ may range in value from about 0.6 to about 1 times the critical value of $v/G_0$ (i.e., about $1.3 \times 10^{-5}$ cm$^2$/sK to about $2.1 \times 10^{-5}$ cm$^2$/sK based upon currently available information for the critical value of $v/G_0$), and preferably from about 0.5 to about 1.05 times the critical value of $v/G_0$ (i.e., about $1 \times 10^{-5}$ cm$^2$/sK to about $2.2 \times 10^{-5}$ cm$^2$/sK based upon currently available information for the critical value of $v/G_0$). Most preferably, however, the dwell time will be controlled such that the ratio $v/G_0$ may have any value less than about 1.05 times the critical value of $v/G_0$.

It should be noted that the precise range of acceptable values for $v/G_0$ is at least partially dependent upon the desired width of the axially symmetric region to be obtained. Accordingly, while the above ranges exhibit the flexibility of the present process when the width of this region is about equal to the width of the constant diameter portion of the ingot, this flexibility is even greater when it is acceptable for the width of this region to be less than the radius of the ingot. In such instances, the growth velocity, v, and the average axial temperature gradient, $G_0$, may be controlled such that the ratio $v/G_0$ ranges in value from about 0.6 to about 1.5 times the critical value of $v/G_0$ (i.e., about $1.3 \times 10^{-5}$ cm$^2$/sK to about $3 \times 10^{-5}$ cm$^2$/sK based upon currently available information for the critical value of $v/G_0$), and preferably from about 0.5 to about 2.5 times the critical value of $v/G_0$ (i.e., about $1 \times 10^{-5}$ cm$^2$/sK to about $5 \times 10^{-5}$ cm$^2$/sK based upon currently available information for the critical value of $v/G_0$). Strictly speaking, however, when the only goal is the formation of an axially symmetric region of interstitial dominated material of some minimum radial width (i.e., at least about 30%, 40%, 80% or more of the constant diameter portion), then $v/G_0$ may be essentially any value greater than the critical value, provided that at some position along the radius the value falls below that value which is need to result in the formation this axially symmetric region of the desired width.

It should be further noted that, given a dwell time which is long enough to allow for sufficient vacancy diffusion, an axially symmetric region of vacancy dominated material may also be formed. If the width of this region is to be about equal to the radius of the constant diameter portion of the ingot, $v/G_0$ may range from about 0.95 to about 1.1 times the critical value of $v/G_0$. However, as pointed about above with reference to an interstitial dominated region, if the width of this vacancy dominated region is less than the radius of the ingot, greater variations in $v/G_0$ are acceptable.

The above-noted ratios of $v/G_0$ may be achieved by the independent control of the growth velocity, v, and the radial variations in the average axial temperature gradient, $G_0(r)$. While a single value of $v/G_0$ within the range may be achieved during the growth process by careful control of the growth velocity and design of the crystal puller hot zone, preferably $v/G_0$ will be allowed to vary within the noted range during the growth of the axially symmetric region. Such variation may result from (i) allowing the growth velocity to vary during growth in a crystal puller hot zone designed in such a way that $G_0$ is essentially constant over the radius and length of the region (ii) maintaining a constant growth velocity while $G_0$ is allowed to vary, or (iii) allowing both v and $G_0$ to vary.

Prior to the present invention, a conflict has existed between controlling $v/G_0$ to prevent the formation of agglomerated defects and controlling process conditions for conventional growth purposes, such as to maintain a constant diameter off the ingot main body or grow the end-cone. This conflict has meant that if agglomerated defects are to be prevented, this prevention must be achieved at some cost. However, in accordance with the present process, $v/G_0$ is allowed to vary, which means in one embodiment the pull rate may also vary, in order for example to maintain diameter control. Accordingly, as an example, the pull rate after about one diameter of the crystal length may range from about 0.3 mm/minute to about 0.5 mm/minute, from about 0.25 mm/minute to about 0.6 mm/minute, or from about 0.2 mm/minute to about 0.8 mm/minute, the range of acceptable pull rates increasing as the process flexibility increases.

It is to be noted that the pull rate is dependent upon both the crystal diameter and crystal puller design. The stated ranges are typical for 200 mm diameter crystals. In general, the pull rate will decrease as the crystal diameter increases. However, the crystal puller may be designed to allow pull rates in excess of those stated here. As a result, most preferably the crystal puller will be designed to enable the pull rate to be as fast as possible, and thus allow $v/G_0$ to vary as much as possible, while still prevent the formation of agglomerated intrinsic point defects.

In addition to allowing for variations in the pull rate, or more generally variations in v, the flexibility of the present process also allows for $G_0$ to vary or drift. More specifically, because $v/G_0$ is allowed to vary, the present process is more robust, thus allowing for these variations to occur regardless of the cause; that is, the robust nature of the present process allows for variations in $v/G_0$ to occur when $G_0$ is constant and v varies, when v is constant and $G_0$ varies, or when both vary. For example, the present process affords the means by which to prepare, in a given crystal puller, a series of single crystal silicon ingots in which the formation of agglomerated intrinsic point defects is prevented and wherein both the pull rate and $G_0$ may drift during their preparation. As a result, the need to maintain a constant pull rate (at the cost of diameter control), as well as the need to continuously monitor the temperature profile for the given crystal puller hot zone and make adjustments in the process conditions as the hot zone parts age (thus causing $G_0$ to drift), are eliminated.

By taking advantage of self-interstitial or vacancy diffusion through controlling the dwell time, the present process effectively creates a larger "window" of $v/G_0$ values which can be utilized to obtained an axially symmetric region of the constant diameter portion of the ingot which is substantially free of agglomerated intrinsic point defects. It is to be noted however, that increasing the window size (or allowable v or $G_0$ variations for defect-free growth) is substantially limited to those values of v and $G_0$ which result in values for the ratio $v/G_0$ which are smaller than the critical $v/G_0$ value. Stated another way, the effect is strongest for interstitial dominated material because silicon self-interstitials diffuse more quickly than vacancies. As a result, the window opens more quickly toward lower values for $v/G_0$. For example, increasing the window size for allowable pull rate variations is substantially limited to slower pull rates because, due to the diffusivity of interstitials, the window opens more quickly toward these lower pull rates.

In principle, however, as the time the ingot spends at temperatures greater than about 900° C. increases, the window for allowable $v/G_0$ variations due to $v/G_0$ values greater than the critical value of $v/G_0$ plus some small delta (resulting from, for example, variations toward faster pull rates) also increases; that is, as the dwell time increases, in principle the window of acceptable $v/G_0$ values for vacancy dominated material also increases because greater time is allowed for vacancies to diffuse. Such a relationship can be expressed by Equation (3):

$$[(v/G_0)_{cr}+\delta(t)_{cr}] > v/G_0(r_0) > [(v/G_0)_{cr}-\Delta(t)_{cr}] \quad (3)$$

wherein $[(v/G_0)_{cr}+\delta(t)_{cr}]$ is the sum of the critical value for $v/G_0$ plus some delta, the delta being a factor of how much time a given axial position within the ingot is allowed to dwell above the critical temperature (i.e., the temperature at which agglomerations would otherwise occur)

$v/G_0(r_0)$ is the same as in Equation (2), above; and, $[(v/G_0)_{cr}-\Delta(t)_{cr}]$ is the same as in Equation (2), above.

As can be seen from the expression $[(v/G_0)_{cr}+\delta(t)_{cr}]$, as the dwell time increases, so the range of values for $v/G_0$ above the critical value also increases. However, due to the slower diffusion rate of vacancies, the formation of an axially symmetric region of vacancy dominated material which is substantially free of agglomerated intrinsic point defects would require significantly longer times for diffusion, particularly given that this region extends from the central axis to the circumferential edge of the constant diameter portion of the ingot.

"Local" Cooling Rate

In addition to controlling time during which the ingot dwells within the noted range, it is also preferred to control the rate at which the ingot cools within this range and over this time period. Stated another way, while it is preferred to maintain the ingot above the temperature at which agglomerated defects will form for a period of time, it is also preferred to control the "local" (in time) cooling rate; that is, the rate at which the ingot cools within this time and temperature range. For example, referring now to FIG. 2, it may be observed that for each local temperature within the range bounded by the solidification temperature, and more specifically the temperature at which the initial concentration of intrinsic point defects is established (i.e., some temperature between about 1400° C. and about 1300° C.) and the temperature at which intrinsic point defects are no longer sufficiently mobile for agglomerations to occur (i.e., some temperature greater than about 900° C.), there exists an equilibrium concentration $C_{eq}$ and a critical or nucleation concentration $C_n$ where a reaction or agglomeration occurs. Accordingly, for a given concentration (denoted point A) above the equilibrium concentration but below the critical concentration, if sufficient time is spent at a single temperature above the temperature of agglomeration, eventually enough interstitials will out-diffuse such that the equilibrium concentration is reached (denoted point B) However, if the temperature is then rapidly reduced, an agglomeration may still occur (denoted point D). As a result, to ensure sufficient time for out-diffusion it is preferred that a given axial position in the growing ingot (denoted point A) remain above the temperature of agglomeration for the requisite time, but in addition that it be cooled at a rate which prevents the critical concentration from being exceeded (see, e.g., path denoted E).

Figure 2:
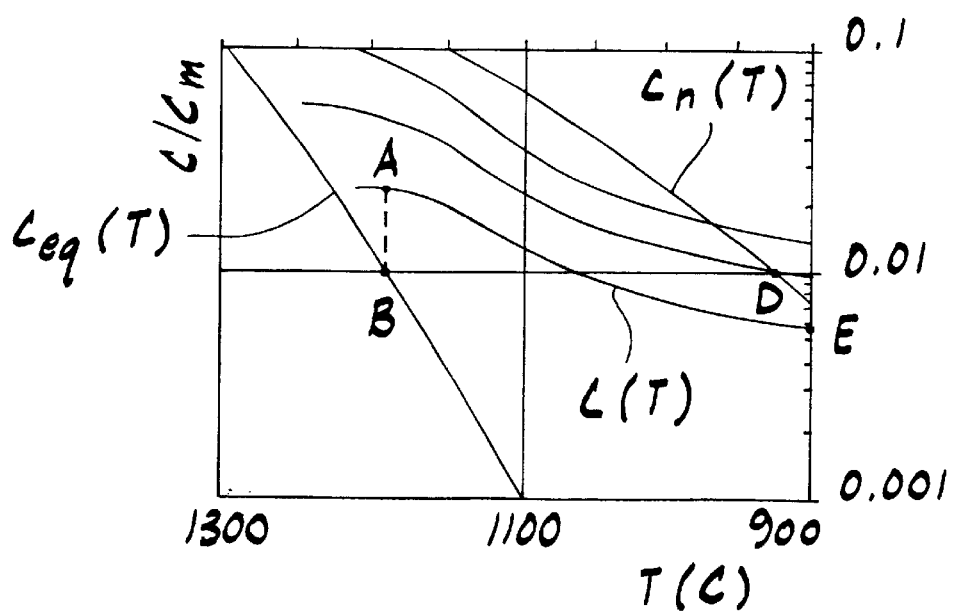
FIG. 2 is a graph illustrating the equilibrium concentration and the critical concentration (i.e., the concentration at which agglomerated defects forms) as a function of temperature, as further discussed herein.

It is also to be noted from FIG. 2 that experience to-date suggests that the concentration of interstitials at a given temperature (i.e., C(T)), between the reaction or nucleation temperature and the equilibrium temperature for that concentration, decreases much slower than the corresponding equilibrium concentration (i.e., $C_{eq}(T)$); that is, experience to-date suggests that C(T) decreases much slower than $C_{eq}$. As a result, as the temperature decreases, C moves away from $C_{eq}$ and toward the nucleation concentration, $C_n$, which means if the ingot cools too fast eventually the curve C(T) will intersect with $C_n(T)$ and thus an agglomeration event will occur. Accordingly, it should be noted that while a high cooling rate may be acceptable at higher ingot temperatures, as the ingot cools the rate will preferably decrease to ensure nucleation, and thus agglomeration, do not occur. It should be further noted, however, that the temperature at which C(T) intersects with $C_n(T)$ is at least in part a function of the initial defect concentration and the rate at which the defects diffuse through the crystal lattice of the ingot.

In accordance with the present process, therefore, the manner in which the ingot cools within the range of temperatures in which self-interstitials, or alternatively vacancies, appear to be mobile is controlled such that the ingot cools from a first temperature, $T_1$, to a second temperature, $T_2$, with the rate of temperature decrease from $T_1$ to $T_2$ being controlled such that at each intermediate temperature, $T_{int}$, between $T_1$ and $T_2$ the axially symmetric region has a concentration of intrinsic point defects which is less than the critical concentration at which agglomerated intrinsic point defects will form. The first temperature, $T_1$, is typically between about 1400° C. and about 1300° C., preferably between about 1350° C. and about 1310° C. The second temperature, $T_2$, is typically between about 1050° C. and about 800° C., preferably between about 1000° C. and about 900° C., and most preferably between about 975° C. and about 925° C.

Referring again to FIG. 2, it is to be noted that typically the rate at which the axially symmetric region of the ingot cools between $T_1$ and $T_2$ will be controlled such that, at any given temperature, the actual concentration of self-interstitials, or vacancies, remains below the concentration at which agglomeration will occur but well above the equilibrium concentration in order to ensure the greatest rate of diffusion possible. For example, the rate may be controlled such that at a given axial position the actual concentration of intrinsic point defects within the axially symmetric region can be expressed as in Equation (4):

$$C = C_{eq} + X(C_n - C_{equil}) \qquad (4)$$

wherein

C is the actual concentration of intrinsic point defects at the given axial position;

$C_{eq}$ is the equilibrium concentration of intrinsic point defects for this axial position;

X is a constant, typically ranging from about 0.4 to less than about 1, and preferably from about 0.6 to about 0.9; and, $C_n$ is the concentration of intrinsic point defects which is sufficient to cause an agglomeration reaction to occur at this axial position.

It is to be noted that, while it is generally preferred that the crystal growth conditions be controlled to maximize the width of the interstitial dominated region, there may be limits for a given crystal puller hot zone design. As the V/I boundary is moved closer to the central crystal axis, provided the cooling conditions and $G_0(r)$ do not change, the minimum amount of radial diffusion required increases. In these circumstances, there may be a minimum radius of the vacancy dominated region which is required to suppress the formation of agglomerated interstitial defects by radial diffusion.

It is to be further noted that, in order to achieve the effects of controlling the cooling rate and dwell time over appreciable lengths of the constant diameter portion of the ingot, consideration must also be given to the growth process of the end-cone of the ingot, as well as the treatment of the ingot once end-cone growth is complete, to ensure that the latter portion of the main body of the ingot generally has the same thermal history as the portions which preceded it. Several approaches to dealing with this situation are discussed in detail in, for example, PCT/US98/07365 and PCT/US98/07304.

It is also to be noted that, as crystal puller and hot zone designs vary, the ranges presented above for $v/G_0$, pull rate, cooling time and cooling rate may also vary.

For an ingot prepared in accordance with the process of the present invention and having a V/I boundary, i.e. an ingot containing material which is vacancy dominated, experience has shown that low oxygen content material, i.e., less than about 13 PPMA (parts per million atomic, ASTM standard F-121-83), is preferred. More preferably, the single crystal silicon contains less than about 12 PPMA oxygen, still more preferably less than about 11 PPMA oxygen, and most preferably less than about 10 PPMA oxygen. This is because, in medium to high oxygen contents wafers, i.e., 14 PPMA to 18 PPMA, the formation of oxygen-induced stacking faults and bands of enhanced oxygen clustering just inside the V/I boundary becomes more pronounced. Each of these are a potential source for problems in a given integrated circuit fabrication process. However, it is to be noted that, when the axially symmetric region has a width about equal to the radius of the ingot, the oxygen content restriction is removed; this is because, given that no vacancy type material is present, the formation of such faults and clusters will not occur.

Process/System Design

As previously discussed, the type and initial concentration of intrinsic point defects within the growing single crystal silicon ingot are a function of the actual value of the ratio of $v/G_0$ relative to the critical value of $v/G_0$. The critical growth velocity, $v_{cr}$, may be express as in Equation (5):

$$v_{cr} = \xi G_0 \qquad (5)$$

wherein $G_0$ is the average axial temperature gradient; and, $\xi$ represents the critical value, which is currently believed to be about $2.1 \times 10^{-5}$ cm²/sK.

If $G_0$ is constant over the radius of the ingot, then the type and initial concentration of these defects are primarily a function of v; that is, the type and initial concentration of intrinsic point defects may be expressed in terms of the ratio $v/v_{cr}$. Accordingly, if the growth velocity v is greater than $v_{cr}$ then vacancies are predominant, while if v is less than $v_{cr}$ self-interstitials are predominant.

A relationship exists between the growth velocity, the time the ingot dwells above the agglomeration temperature and the distance over which a given axial position travels as the ingot cools from near the solidification temperature to the agglomeration temperature, such that the formation of agglomerated intrinsic point defects is prevented. The relationship between this distance, or "dwell length" ($L_{dw}$), the growth velocity and the dwell time is expressed in Equation (6) as follows:

$$t = L_{dw}/v. \qquad (6)$$

It is to be noted that the temperature profile is believed to be almost unaffected by variations in v, such that $L_{dw}$ may be considered as a constant for a given hot zone.

Solving the problem of silicon self-interstitial diffusion in a single crystal silicon ingot, by means commonly known in the art, additionally leads to the conclusion that, when $G_0$ is constant, the relationship between $L_{dw}$, a given growth velocity less than or equal to the critical velocity and the concentration of self-interstitials (relative to the melting point equilibrium concentration $C_m$; i.e., the concentration of self-interstitials at the time of solidification) may be expressed as in Equation (7):

$$C/C_m = 1.602 B(1 - v/v_{cr}) \exp(\mu \cdot L_{dw}) \qquad (7)$$

wherein $C/C_m$ is the "normalized" concentration (i.e., the concentration of self-interstitials relative to the concentration at the time of solidification);

B is a proportionality coefficient which is dependent upon the assumed point defect parameters; a reasonable estimate is about 0.5;

$v/v_{cr}$ is the actual growth velocity relative to the critical growth velocity;

$\mu$ is a decay coefficient which, for the typical growth parameters of common Cz-type silicon wherein the contribution of axial diffusion is small, may be expressed as equal to $(D/v)(\lambda_1/R)^2$, wherein D is the diffusivity of self-interstitials, v is the growth velocity, $\lambda_1$ is the first root of the Bessel function, $J_0(\lambda_1)=0$, and is equal to about 2.40 and R is the radius.

Based upon experimental evidence to-date, it is generally believed that at a temperature of about 900° C. to about 925° C., the formation of agglomerated defects can be avoided if the value of the ratio $C/C_m$ is less than about 0.01, and preferably less than about 0.005. Using these values and Equation (7), the degree of variability that is acceptable (i.e., the degree of variability a given system can have and still yield a substantially defect-free axially symmetric region of a width essentially equal to the radius of the ingot) for a given dwell length can be determined. Alternatively, using these values and the known or desired variability in a given crystal pulling process, a dwell length can be determined which is sufficient to yield a substantially defect-free axially symmetric region of a width essentially equal to the radius of the ingot. In other words, given that some variation in process conditions is to be expected, the relationship provided in Equation (7) may be used to provide the details needed to design a robust process; that is, Equation (7) may be used to design a system which is capable of coping with expected process variations and still enable the growth of substantially defect-free silicon.

Figure 4:
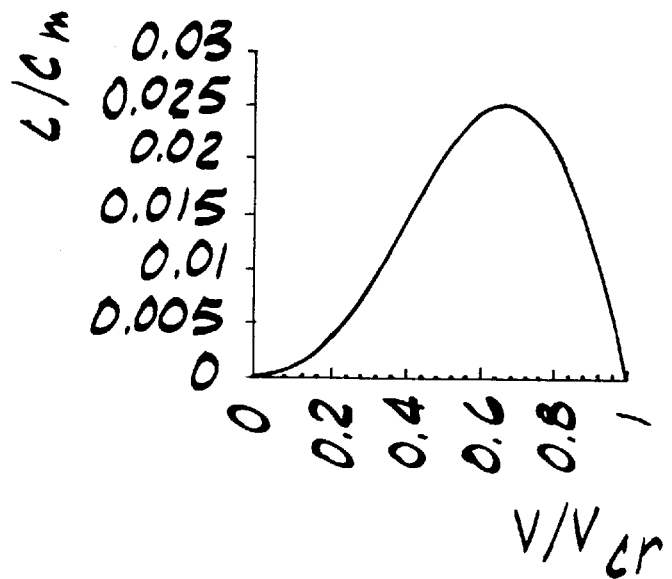
FIG. 4 is a graph illustrating the relationship between the normalized concentration of self-interstitial intrinsic point defects and the normalized growth velocity.
Figure 5:
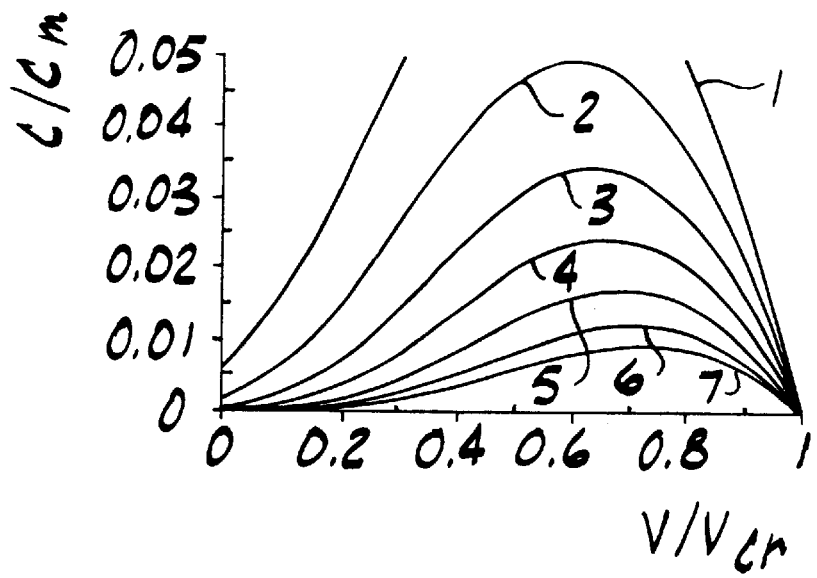
FIG. 5 is a graph illustrating the relationship between the normalized concentration of self-interstitial intrinsic point defects and the normalized growth velocity for various dwell lengths.

Referring now to FIG. 4, it may be observed that for a given dwell length, the normalized concentration increases as the actual velocity, relative to the critical velocity, (i.e., $v/v_{cr}$) decreases until the growth velocity become so slow that sufficient time is allowed for self-interstitials to out-diffusion, effectively lowering the overall concentration. Experimental evidence to date suggests that for the particular process conditions and system represented (i.e., $v_{cr}=0.28$ mm/min.; ingot radius=100 mm; $L_{dw}$ 690 mm), the relative critical concentration which, if exceeded, results in the formation of agglomerated intrinsic point defects, is believed to be about 0.01, while in some instances it may be about 0.005 or less. Accordingly, it may be observed that the actual growth velocity must be very close, or very far away from, the critical velocity if the formation of agglomerated intrinsic point defects is to be prevented; that is, in this instance there are two "windows" for $v/G_0$ which enable the formation of agglomerated defects to be avoided, one very near to the critical value and one far away from it. Referring now to FIG. 5, it can be seen that as $L_{dw}$ increases for a given growth velocity, the corresponding relative concentration of silicon self-interstitials decreases (where curves 1–7 correspond, respectively, to dwell lengths of 400 mm, 500 mm, 600 mm, 700 mm, 800 mm, 900 mm and 980 mm).

Increasing $L_{dw}$ effectively extends the range of actual growth velocities which are acceptable for purposes of growing a single crystal silicon ingot which is substantially free of agglomerated defects. As $L_{dw}$ continues to increase, eventually this "window" of acceptable growth velocities extends over the entire range (see, e.g., FIG. 5, curve 7); that is, $L_{dw}$ eventually reaches a critical value at which $C<C_{cr}$ at any $v<v_{cr}$. It can be seen that for the present example, the critical value for $L_{dw}$ is about 980 mm, which is comparable to the typical length of a Cz-type single crystal silicon ingot. Therefore, to prevent the formation of agglomerated defects over the entire usable length of the crystal, the pulling of the ingot must continue at the same rate even after growth is complete in order to ensure sufficient dwell time (unless the ingot is prepared following an alternative growth process, such as by holding the ingot in the pull chamber after growth is complete with while maintaining, and then slowly cooling, the ingot using pull chamber "after" heaters).

Figure 6:
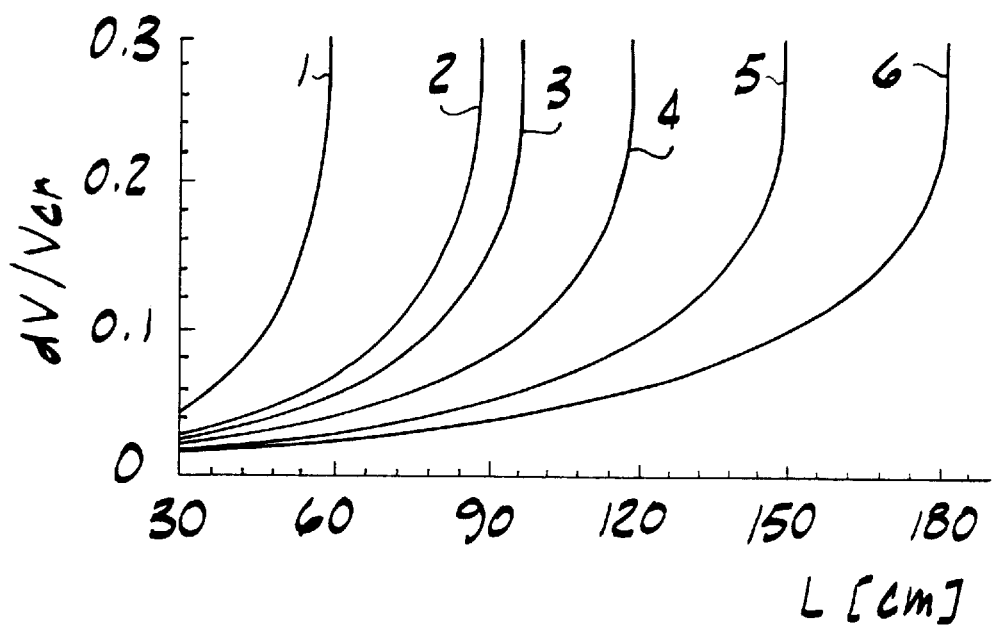
FIG. 6 is a graph illustrating the relationship between variations in growth velocity (as compared to the critical growth velocity) and the dwell length needed in order to prevent the formation of agglomerated defects, for various critical growth velocities (for crystal diameters of 200 mm).
Figure 7:
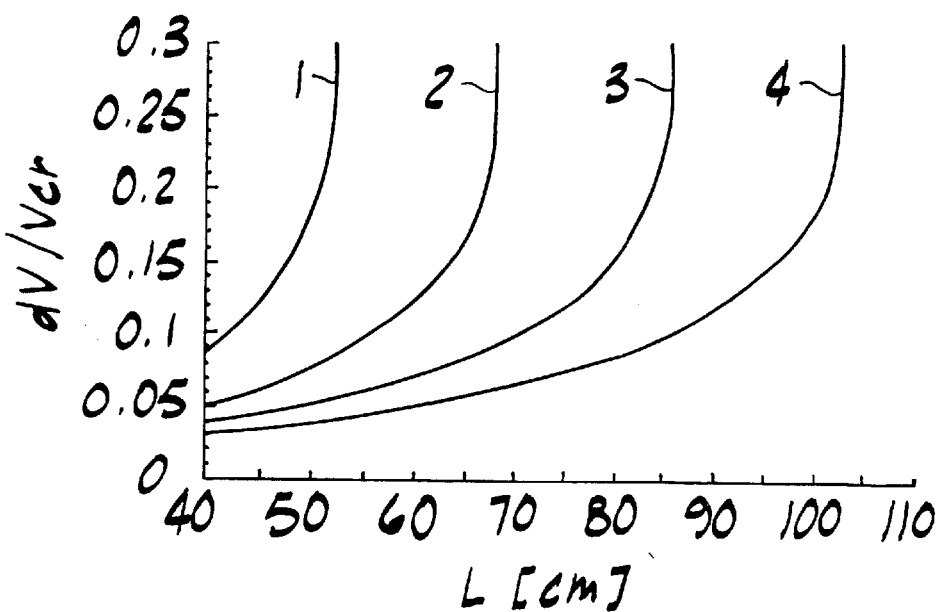
FIG. 7 is a graph illustrating the relationship between variations in growth velocity (as compared to the critical growth velocity) and the dwell length needed in order to prevent the formation of agglomerated defects, for various critical growth velocities (for crystal diameters of 150 mm).
Figure 8:
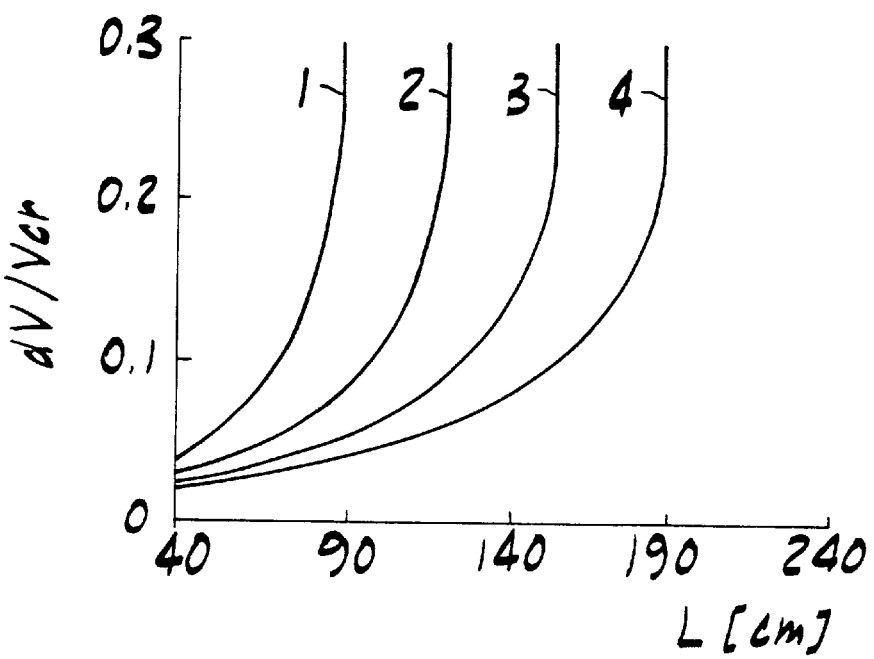
FIG. 8 is a graph illustrating the relationship between variations in growth velocity (as compared to the critical growth velocity) and the dwell length needed in order to prevent the formation of agglomerated defects, for various critical growth velocities (for crystal diameters of 300 mm).

Referring now to FIGS. 6–8, the dependence of this window of acceptable growth velocities on $L_{dw}$ is further illustrated. These curves may be used to determine the dwell length needed in order to obtain substantially defect-free silicon in view of the known or desired variability in a given set of process conditions. Stated another way, given that each crystal puller hot zone has an inherent critical $G_0$ and, as such, has a corresponding $v_{cr}$, once the amount of variability in a given process is determined, or a desired variability is established, this ratio of $v/v_{cr}$ can be used in conjunction with the graphs present in FIGS. 6–8 to generally determine the dwell length needed to prevent the formation of agglomerated defects.

As an example, if a 200 mm diameter ingot is to be grown (see, e.g., FIG. 6) in a crystal puller have a thermal profile such that $v_{cr}$ is about 0.28 mm/minute (i.e., curve 3) and the desired variability is about 20%, then a single crystal silicon ingot may be grown, the entire usable length of which is substantially free of agglomerated defects, if the $L_{dw}$ is about 100 cm in length. Stated another way, such an ingot can be grown if, by employing upper heaters and reflector for example, the hot zone is design so that each axial position of the constant diameter portion of the ingot travels about 100 cm while cooling from about the temperature of solidification to the critical temperature at which agglomerations would otherwise form.

It is to be noted, in regard to FIGS. 6–8, which correspond to ingot diameters of 200 mm, 150 mm and 300 mm, respectively, that dwell lengths are provided for a number of different $v_{cr}$ values, the curves in each graph corresponding to the $v_{cr}$ values as given below in Table I:

TABLE I

| Curve | $v_{cr}$ (FIG. 6) | $v_{cr}$ (FIG. 7) | $v_{cr}$ (FIG. 8) |
| --- | --- | --- | --- |
| 1 | 0.15 mm/min | 0.25 mm/min | 0.10 mm/min |
| 2 | 0.25 mm/min | 0.35 mm/min | 0.15 mm/min |
| 3 | 0.28 mm/min | 0.45 mm/min | 0.20 mm/min |
| 4 | 0.35 mm/min | 0.55 mm/min | 0.25 mm/min |
| 5 | 0.45 mm/min | — | — |
| 6 | 0.55 mm/min | — | — |

Referring again to FIG. 5, it can be observed that if the dwell length is sufficiently great, the actual growth velocity may be any value less than about the critical value, in order grow a single crystal silicon ingot of interstitial dominated material which is substantially free of agglomerated defects. More specifically, it may be observed from curve 7 that as $L_{dw}$ approaches about 970 mm, which in this example is the critical length ($L_{cr}$), the "window" for variations in the v, and thus $v/G_0$, is essential completely open; that is, if $L_{dw}$ is about 970 mm, then all values less than about $v_{cr}$, and thus all values of $v/G_0$ less than the critical value of $v/G_0$ plus some delta to allow for the annihilation of vacancies by recombination (given that $G_0$ is assumed to be essentially constant here), will enable the growth of interstitial-dominated single crystal silicon which is substantially defect-free.

The dependence of the critical value of $L_{dw}$ on $v_{cr}$ may be further illustrated by Equation (8) (wherein all units are mm and minutes):

$$L_{cr}=0.35 v_{cr} R^2 \qquad (8)$$

wherein

L$_{cr}$ is the critical value for L$_{dw}$; that is, the length which is sufficient to allow v to be any value less that v$_{cr}$ and still prevent the formation of agglomerated defects;

v$_{cr}$ is the critical value for the growth velocity (mm/minute), as described above; and, R is the radius of the ingot being grown.

Figure 9:
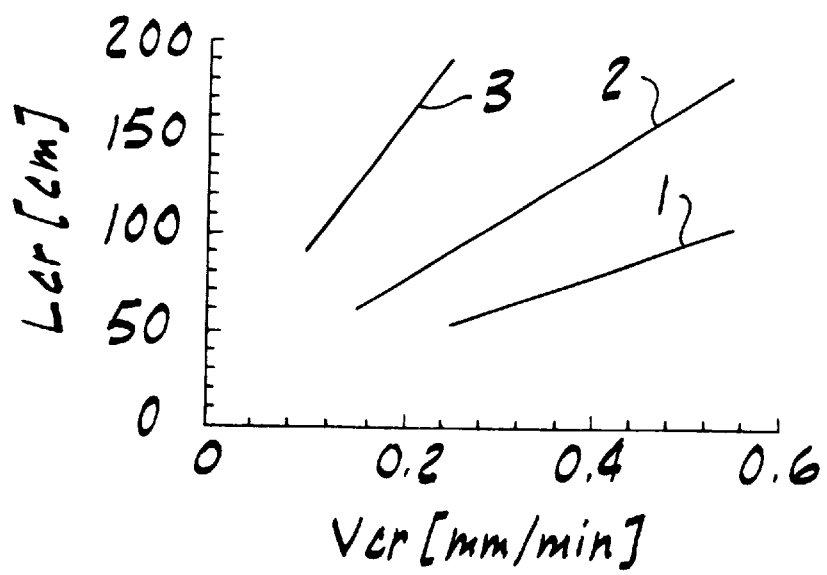
FIG. 9 is a graph illustrating the relationship between the critical dwell length and the critical growth velocity for ingots of various diameters.

The relationship between the critical length for L$_{dw}$ and the critical growth velocity v$_{cr}$ is further illustrated by FIG. 9 for ingot diameters of 150 mm, 200 mm and 300 mm (curves 1, 2 and 3, respectively). More specifically, the graph presented in FIG. 9 shows the relationship between v$_{cr}$ when the "window" of acceptable variations is completely open (i.e., any variation for interstitial dominated growth is acceptable) and the corresponding L$_{dw}$ needed in order to obtain an ingot which is substantially defect-free over essentially the entire usable length.

It is to be noted that while the above expression is for purposed of describing the relationship between the critical value for L$_{dw}$, the growth velocity, and the radius when the width of the axially symmetric region is about equal to the width of the ingot, a similar expression may be given when the width is less than equal to the radius of the ingot. More specifically, if the width of the axially symmetric region is less than equal to the radius of the ingot, then R (denoting the radius of the ingot) in Equation (8) is replaced with (R-R$_v$), wherein R$_v$ represents the width of the vacancy dominated core as determined by measuring from the central axis radially outward to the V/I boundary. Accordingly, the radius of the ingot has been replaced by the width of the self-interstitial dominated region, due at least in part to the fact that the diffusion distance has decreased. A similar relationship may be provided when the focus is upon the vacancy dominated region as the region which is substantially defect free, wherein R is replaced with (R-R$_1$), R$_1$ representing the width of the interstitial dominated ring.

It is to be further noted that while the above described relationships are based on the assumption that G$_0$ is constant across the radius of the ingot, generally speaking, the same is true for the situation wherein G$_0$ varies radially. More specifically, radial variations in G$_0$ are acceptable when growth conditions are controlled to ensure self-interstitials predominate (excluding of course a core of vacancy-dominated material which may be annihilated by recombination with interstitials) because, given sufficient time, out-diffusion of self-interstitials acts to compensate for any variation in the initial concentration of intrinsic point defects. While significantly long periods of time would be required, the same is essentially true when vacancies predominate, as well.

While the robust nature, or flexibility, of the present process allows for radial variations in G$_0$, it should also be noted that the present process allows for axial variations in G$_0$, as well. More specifically, changes in the initial concentration of intrinsic point defects (i.e., the concentration after the ingot has cooled to about 1300° C., or even about 1325° C.) generally near the central axis (where diffusion distance is typically the greatest) may occur from one axial position to the next as a result ofi changes in G$_0$, as well as v. Accordingly, the effects of outdiffusion can be utilized to offset these changes in defect concentration regardless of the cause.

Figure 10:
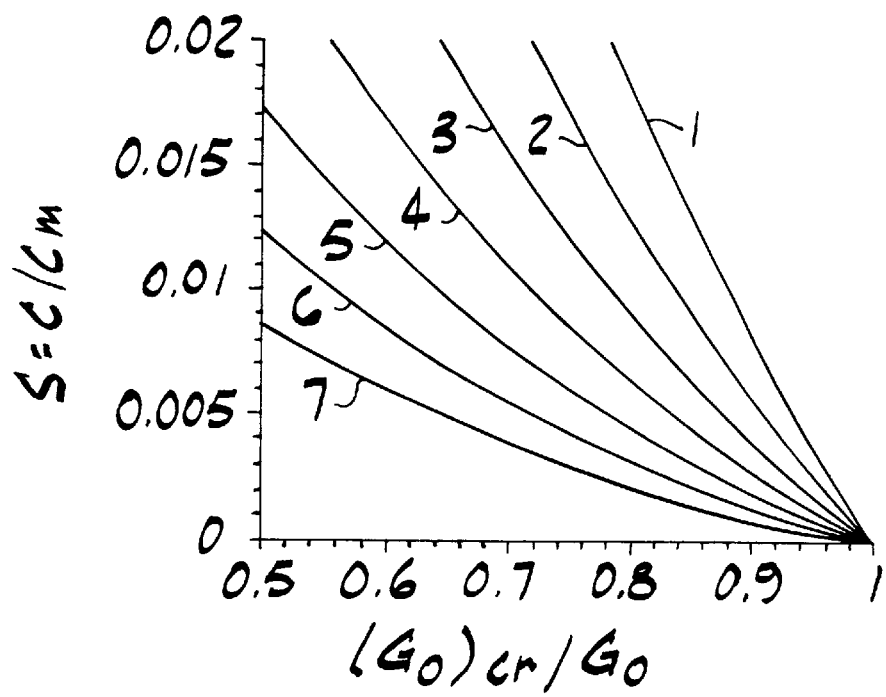
FIG. 10 is a graph illustrating the relationship between the normalized concentration of silicon self-interstitials at the critical temperature and the ratio of the critical value of $G_0$ over the actual value of $G_0$, and the impact of changing dwell lengths thereon, for a 150 mm diameter single crystal silicon ingot.
Figure 11:
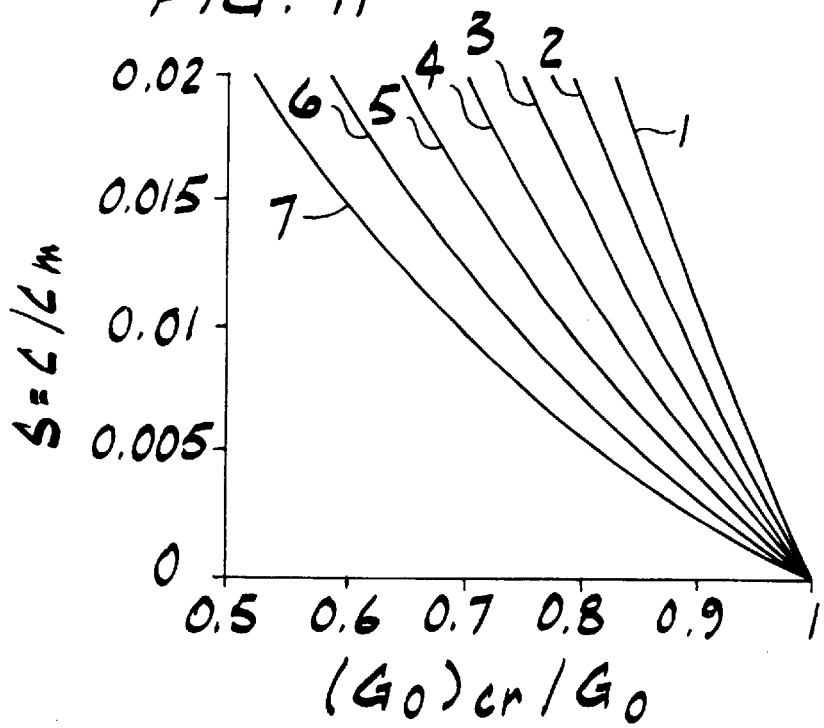
FIG. 11 is a graph illustrating the relationship between the normalized concentration of silicon self-interstitials at the critical temperature and the ratio of the critical value of $G_0$ over the actual value of $G_0$, and the impact of changing dwell lengths thereon, for a 200 mm diameter single crystal silicon ingot.

Referring now to FIGS. 10 and 11, the relationship between the normalized value S of the threshold interstitial concentration (i.e., the ratio of the concentration C at the temperature T$_{cr}$ at which agglomerations might otherwise form over the concentration C$_{im}$ at the time of solidification) and the ratio of the critical value of G$_0$ over the actual value of G$_0$ is plotted. It is to be noted that experience to-date suggests this normalized value of the threshold concentration is less than about 0.01, possibly about 0.005; that is, the formation of agglomerated self-interstitial intrinsic point defects can be avoided provided the normalized concentration remains below this value.

Referring now to FIG. 10 and corresponding Table II, below, the relationship between changes in (G$_0$)$_{cr}$/G$_0$ and the normalized interstitial concentration may be observed for a single crystal silicon ingot having a nominal diameter of about 150 mm, for a number of different dwell lengths. From this plot, it can be seen that as the dwell length continues to increase (moving right to left from curve 1 to curve 7), more and more of the curve is below the estimated threshold concentration of about 0.005, thus allowing for greater variability in G$_0$. Specifically, as can be seen from Table II, for a constant pull rate (about 0.28 mm/min. here) a "window" of about 30% variability is afforded G$_0$ by a dwell length which is within about a typical crystal length (i.e., less than about 100 cm).

TABLE II

| Curve | L$_{dw}$ | delta (G$_0$)$_{cr}$/G$_0$ |
|---|---|---|
| 1 | 30 cm | 5% |
| 2 | 40 cm | 7% |
| 3 | 50 cm | 10% |
| 4 | 60 cm | 13% |
| 5 | 70 cm | 18% |
| 6 | 80 cm | 24% |
| 7 | 90 cm | 31% |

(R = 7.5 cm; v = 0.28 mm/min.; D$_I$ = 2 × 10$^{-4}$ cm$^2$/sec.)

A similar observation can be made from FIG. 11 and corresponding Table III, below, for a single crystal silicon ingot having a nominal diameter of about 200 mm. Once again, it can be seen from the plot that as the dwell length increases, more of the curve is below the estimated threshold concentration of about 0.005, thus allowing for greater variability in G$_0$. However, as Table III indicates, the impact of the same increase in dwell length is lessened here, due to the increase in diffusion distance necessary to effectively suppress the interstitial concentration and thus prevent the formation of agglomerated defects.

TABLE III

| Curve | L$_{dw}$ | delta (G$_0$)$_{cr}$/G$_0$ |
|---|---|---|
| 1 | 30 cm | 4% |
| 2 | 40 cm | 5% |
| 3 | 50 cm | 6% |
| 4 | 60 cm | 8% |
| 5 | 70 cm | 10% |
| 6 | 80 cm | 12% |
| 7 | 90 cm | 15% |

(R = 10 cm; v = 0.28 mm/min.; D$_I$ = 2 × 10$^{-4}$ cm$^2$/sec.)

It is to be noted that the calculated width of the "window" of values for G$_0$ which enable the formation of agglomerated defects to be prevented is at least in part dependent upon the estimated value for S, as well as the assumed interstitial diffusivity value D$_1$ (which in the present examples is estimated to be about 2×10$^{-4}$ cm$^2$/sec.). However, the qualitative results presented here are believed to be the same within a reasonable range of values for S and D$_1$.

It is to be further noted that, as can be observed from FIGS. 10 and 11, unlike the case discussed above wherein G$_0$ remained constant while v was allowed to vary (see, e.g., FIGS. 4 and 5), the curves presented here do not reach a maximum. Stated another way, when v is allowed to vary, as the dwell length continues to increase, eventually a point is reached where the entire curve falls below the critical concentration. In contrast, when $G_0$ is allowed to vary, no such point is reached; that is, the $G_0$ "window" of acceptable values does not become complete open as it does when v is allowed to vary.

Additionally, as can be observed from FIGS. 10 and 11, the curves continue on an upward slope as $G_0$ increases. In contrast, when v is allowed to vary, the curves initially have an upward slope but then, after reaching a plateau, the curves change to a downward slope. The shape of the v variation curves is due to the offsetting effect of a decrease in v. More specifically, while a decrease in v cause the concentration if interstitials to increase, the time for diffusion also increases. At some point, the effects of diffusion outweigh the increase in concentration. No such offsetting effect is present when $G_0$ is the source of variation, as FIGS. 10 and 11 indicate.

Definitions

As used herein, the following phrases or terms shall have the given meanings: "agglomerated intrinsic point defects" mean defects caused (i) by the reaction in which vacancies agglomerate to produce D-defects, flow pattern defects, gate oxide integrity defects, crystal originated particle defects, crystal originated light point defects, and other such vacancy related defects, or (ii) by the reaction in which self-interstitials agglomerate to produce dislocation loops and networks, and other such self-interstitial related defects; "agglomerated interstitial defects" shall mean agglomerated intrinsic point defects caused by the reaction in which silicon self-interstitial atoms agglomerate; "agglomerated vacancy defects" shall mean agglomerated vacancy point defects caused by the reaction in which crystal lattice vacancies agglomerate; "radius" means the distance measured from a central axis to a circumferential edge of a wafer or ingot; "substantially free of agglomerated intrinsic point defects" shall mean a concentration of agglomerated defects which is less than the detection limit of these defects, which is currently about $10^3$ defects/cm$^3$ "V/I boundary" means the position along the radius of an ingot or wafer at which the material changes from vacancy dominated to self-interstitial dominated; "vacancy dominated" and "self-interstitial dominated" mean material in which the intrinsic point defects are predominantly vacancies or self-interstitials, respectively; and, "$(V/G_0)_{cr}$" is intended to refer to the critical value of $v/G_0$, taking into account the effects of vacancy or self-interstitial annihilation as a result of recombination as the ingot cools.

EXAMPLE

As the following Example illustrates, the present invention affords a process for preparing a single crystal silicon ingot wherein $v/G_0$ may vary, either radially or axially, as a result of changes in v, $G_0$, or both. By utilizing the effects of controlled cooling and the outdiffusion of intrinsic point defects, the present process thus affords greater flexibility in the preparation of single crystal silicon substantially free of agglomerated intrinsic point defects, such that maintaining the value of $v/G_0$ within a narrow, "target" range of values is no longer necessary. It should be noted, however, that the Example sets forth only approach and one set of conditions that may be used to achieve the desired result. Accordingly, it should not be interpreted in a limiting sense.

Example

Two 200 mm crystal ingots were grown in a crystal puller capable of producing a substantially defect-free axially symmetric region of interstitial dominated material having a width and length essentially equal to the radius and length, respectively, of the constant diameter portion of the ingots. Such an axially symmetric region may be achieved in the given crystal puller when the ingots are grown at the rate depicted by the dashed line in FIG. 3A (hereinafter, the "defect-free" growth rate curve).

Figure 3A:
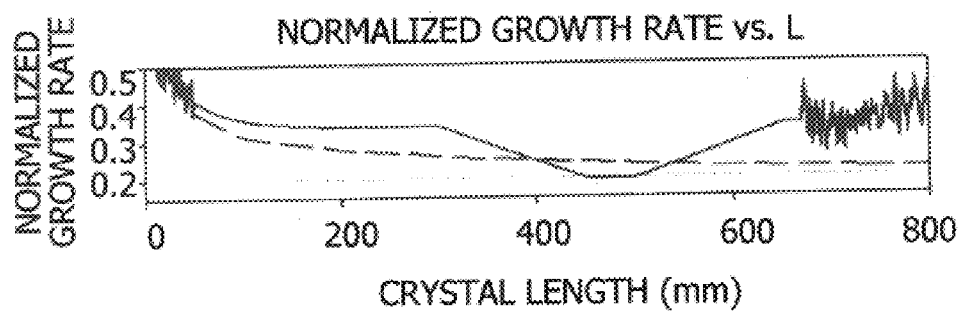
FIG. 3A is a graph of the normalized growth rate as a function of crystal length, as described in the Example.

The two crystals were grown at the same target growth rate, depicted in FIG. 3A as a continuous line, with the growth rate being reported as a normalized growth rate (i.e., the actual growth rate relative to the critical growth rate, typically expressed as a ratio of $v/v_{cr}$). As depicted, these ingots were initially grown for a period of time at a rate which was in excess of the "defect-free" growth rate curve, then for a period of time at a rate which was less than the "defect-free" growth rate curve, and then again for a period of time at a rate in excess of the "defect-free" growth rate curve.

The first ingot (87GEX) was allowed to cool naturally in the crystal growth chamber upon completion of the growth of the ingot. The second ingot (87GEW), however, was not allowed to cool naturally in the crystal growth chamber; instead, upon completion of the growth of the ingot, the heaters in the hot zone of the crystal puller remained on and the ingot was held for 30 hours in the pull chamber.

It is to be noted that, with regard to the second ingot (87GEW), a non-uniform temperature profile was employed, the profile being established such that regions of the ingot more than about 400 mm from the seed end were held at a temperature in excess of about 1,050° C. while regions less than about 400 mm from the seed end were held at a temperature less than about 1,050° C. during this period.

The ingots were sliced longitudinally along the central axis running parallel to the direction of growth, and then further divided into sections, each about 2 mm in thickness. Using a copper decoration technique (as described in PCT/US98/07365 and PCT/US98/07304), followed by a standard defect delineating etch, the samples were visually inspected for the presence of precipitated impurities; those regions which were free of such precipitated impurities corresponded to regions which were free of agglomerated interstitial defects. Photographs were then taken of the sections of each crystal and assembled to show the results for each crystal from seed to tail end. The set of photographs for the first, naturally-cooled ingot (87GEX) are depicted in FIG. 3B and the set of photographs for the second, held ingot (87GEW) are depicted in FIG. 3C.

Figure 3C:
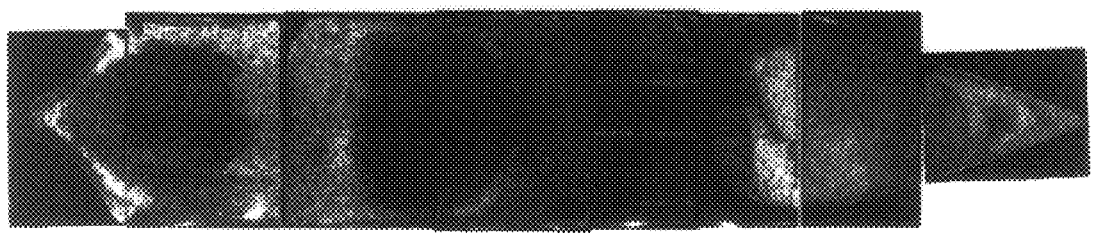
FIG. 3C is a series of photographs of axial cuts of segments of an ingot, ranging from the seed-cone to the end-cone, following copper decoration and a defect-delineating etch, as described in the Example.
Figure 3B:
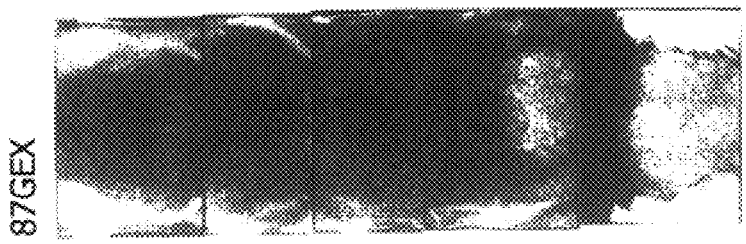
FIG. 3B is a series of photographs of axial cuts of segments of an ingot, ranging from the shoulder to where end-cone growth begins, following copper decoration and a defect-delineating etch, as described in the Example.

Referring now to FIGS. 3A, 3B, and 3C, it can be seen that the naturally-cooled ingot (87GEX) contains agglomerated vacancy defects from 0 to about 393 mm, no agglomerated intrinsic point defects from about 393 mm to about 435 mm, agglomerated intrinsic point defects from about 435 mm to about 513 mm, no agglomerated intrinsic point defects from about 513 mm to about 557 mm, and agglomerated vacancy defects from 557 mm to the end of the crystal. These correspond to the regions above, within and below the defect-free growth conditions for this hot zone. The held ingot (87GEW) contains agglomerated vacancy defects from 0 to about 395 mm, no agglomerated intrinsic point defects from about 395 mm to about 584 mm, and agglomerated vacancy defects from about 584 mm to the end of the crystal. The most significant difference between the two ingots, therefore, occurs in the region from about 435 mm to about 513 mm in which the naturally-cooled ingot (87GEX) contains agglomerated intrinsic point defects whereas the held ingot (87GEW) does not. During the holding period, the concentration of self-interstitial silicon atoms in the held ingot (87GEW) is suppressed by additional diffusion of the self-interstitial atoms to the surface of the ingot and vacancy dominated regions and thus, critical supersaturation and the agglomeration reaction for interstitial atoms is avoided subsequent to crystal solidification. In the naturally cooled ingot, however, insufficient time is allowed for additional diffusion to the surface and vacancy dominated regions and, as a result, the system becomes critically supersaturated in silicon self-interstitial atoms and an agglomeration reaction occurs.

It is to be noted that these ingots therefore illustrate that, given sufficient amounts of time and sufficiently high temperatures, virtually any amount of silicon self-interstitial atoms can be outdiffused to the surface.

It is to be further noted that the "defect-free" growth rate curve depicted in FIG. 3A falls within a range of crystal growth rates which provide fully agglomerated intrinsic defect-free material under natural cooling conditions for this crystal puller configuration. Referring now to Table IV, below, it can be seen that even under natural cooling conditions for this hot zone configuration, there is a range of crystal growth rates between the growth rate ($P_v$) at which agglomerated vacancy defects form and the growth rate ($P_I$) at which agglomerated intrinsic point defects form; this range is at least ±5% of the average of $P_v$, and $P_I$. When the residence time of the grown crystal at temperatures in excess of about 1,050° C. is increased, this range is increased further with the range being, for example, at least ±7.5%, at least ±10%, or even at least ±15% of the average of $P_v$ and $P_I$ (for example, for crystal 87GEW the residence was sufficiently great that, $P_I$, was not achieved and thus, $P_I$ for this crystal was less than the lowest pull rate achieved).

TABLE IV

| | | | 87GEX | | |
|---|---|---|---|---|---|
| Transition | position mm | Normalized Pull rate, V | V_ave | Window (DV) | % variation 100 (DV/Vave) |
| V-P | 393 | 0.251 | | | |
| P-I | 435 | 0.213 | 0.232017 | 0.03865546 | 16.66 |
| I-P | 513 | 0.209 | | | |
| P-V | 557 | 0.249 | 0.22937 | 0.0402521 | 17.55 |

| | | 87GEW | | | |
|---|---|---|---|---|---|
| V-P | 395 | 0.246 | | | |
| P* | 465 | 0.196 | 0.221008 | 0.05042017 | 22.81 |
| P* | 465 | 0.196 | | | |
| P-V | 584 | 0.271 | 0.233193 | 0.07478992 | 32.07 |

*In 87GEW were no P-I transition is observed, we take the minimum V within the window to determine the window size.

For a given crystal puller and hot zone configuration, it may be assumed that the axial temperature gradient, $G_0$, is approximately constant over relatively short distances, such as the transition ranges which occur here. As a consequence, a change in the crystal growth rate leads to a proportional change in $v/G_0$, and thus, the initial concentration of vacancies and silicon self-interstitial atoms. In general, however, the value of $v/G_0$ at the center ingot is the most critical value since it is the farthest distance from the surface. Therefore, the results of this example demonstrate that the increase in pull rate variations achieved through increased dwell times at temperatures greater than about 1000° C. implies those corresponding variations in $v/G_0$ may occur at any point along the radius of the crystal. In other words, radial variation of $v/G_0$ is irrelevant and thus, for example, may exceed (at any radial position) 10%, 15% or more of the value of $v/G_0$ at the center of the ingot.

As can be seen from the above data, by means of controlling the cooling rate, the concentration of intrinsic point defects may be suppressed by allowing more time for these defects to diffuse to regions where they may be annihilated. As a result, the formation of agglomerated intrinsic point defects is prevented within a significant portion of the constant diameter portion of the single crystal silicon ingot. In view of the above, it will be seen that the several objects of the invention are achieved.

As various changes could be made in the above compositions and processes without departing from the scope of the invention, it is intended that all matters contained in the above description are interpreted as illustrative and not in a limiting sense.

What is claimed is:

1. A process for growing a single crystal silicon ingot having a central axis, a seed-cone, an end-cone, a constant diameter portion between the seed-cone and the end-cone, and an ingot segment having silicon-self interstitials as the predominant intrinsic point defect, wherein the segment comprises a fraction of the constant diameter portion and is substantially free of agglomerated intrinsic point defects, the process comprising:

allowing the ratio $v/G_0$ to vary as a function of the length of the ingot segment as the ingot is grown, with $v/G_0$ being allowed to vary between a minimum value, $(v/G_0)_{min}$, and a maximum value, $(v/G_0)_{max}$, where v is the growth velocity and $G_0$ is the average axial temperature gradient between the temperature of solidification and about 1300° C. at the central axis, with $(v/G_0)_{min}$ being no more than about 95% of $(v/G_0)_{max}$; and, cooling the ingot segment from the temperature of solidification to a temperature between about 1050° C. and about 900° C. for at least a dwell length, $L_{dw}$, which is sufficient to prevent the formation of agglomerated intrinsic point defects within the segment, wherein the dwell length is the distance over which a given axial position of the segment travels during ingot growth.

2. The process of claim 1 wherein the ingot segment has a length which is at least about 40% of the length of the constant diameter portion.

3. The process of claim 1 wherein the ingot segment has a length which is at least about 80% of the length of the constant diameter portion.

4. The process of claim 1 wherein the ingot segment has a length which is at least about 90% of the length of the constant diameter portion.

5. The process of claim 1 wherein $(v/G_0)_{min}$ is no more than about 90% of $(v/G_0)_{max}$.

6. The process of claim 5 wherein the ingot segment has a length which is at least about 40% of the length of the constant diameter portion.

7. The process of claim 5 wherein the ingot segment has a length which is at least about 80% of the length of the constant diameter portion.

8. The process of claim 5 wherein the ingot segment has a length which is at least about 90% of the length of the constant diameter portion.

9. The process of claim 1 wherein $(v/G_0)_{min}$ is no more than about 80% of $(v/G_0)_{max}$.

10. The process of claim 9 wherein the ingot segment has a length which is at least about 40% of the length of the constant diameter portion.

11. The process of claim 9 wherein the ingot segment has a length which is at least about 80% of the length of the constant diameter portion.

12. The process of claim 9 wherein the ingot segment has a length which is at least about 90% of the length of the constant diameter portion.

13. The process of claim 1 wherein $(v/G_0)_{min}$ is no more than about 60% of $(v/G_0)_{max}$.

14. The process of claim 13 wherein the ingot segment has a length which is at least about 40% of the length of the constant diameter portion.

15. The process of claim 13 wherein the ingot segment has a length which is at least about 80% of the length of the constant diameter portion.

16. The process of claim 13 wherein the ingot segment has a length which is at least about 90% of the length of the constant diameter portion.

17. The process of claim 1 wherein $(v/G_0)_{min}$ is no more than about 40% of $(v/G_0)_{max}$.

18. The process of claim 17 wherein the ingot segment has a length which is at least about 40% of the length of the constant diameter portion.

19. The process of claim 17 wherein the ingot segment has a length which is at least about 80% of the length of the constant diameter portion.

20. The process of claim 17 wherein the ingot segment has a length which is at least about 90% of the length of the constant diameter portion.

21. The process of claim 1 wherein $(v/G_0)_{min}$ is no more than about 10% of $(v/G_0)_{max}$.

22. The process of claim 21 wherein the ingot segment has a length which is at least about 40% of the length of the constant diameter portion.

23. The process of claim 21 wherein the ingot segment has a length which is at least about 80% of the length of the constant diameter portion.

24. The process of claim 21 wherein the ingot segment has a length which is at least about 90% of the length of the constant diameter portion.

* * * * *